United States Patent
Shino

(10) Patent No.: US 7,256,459 B2
(45) Date of Patent: Aug. 14, 2007

(54) FLOATING BODY-TYPE DRAM CELL WITH INCREASED CAPACITANCE

(75) Inventor: Tomoaki Shino, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/044,348

(22) Filed: Jan. 28, 2005

(65) Prior Publication Data

US 2006/0049444 A1 Mar. 9, 2006

(30) Foreign Application Priority Data

Sep. 9, 2004 (JP) ............................ 2004-262320

(51) Int. Cl.
  H01L 27/01 (2006.01)
  H01L 27/084 (2006.01)
  H01L 27/097 (2006.01)
  H01L 27/075 (2006.01)
(52) U.S. Cl. ...................................... 257/347; 257/348
(58) Field of Classification Search ................ 257/347, 257/348
See application file for complete search history.

(56) References Cited

U.S. PATENT DOCUMENTS

| | | | | |
|---|---|---|---|---|
| 5,936,278 A | * | 8/1999 | Hu et al. ..................... | 257/336 |
| 6,229,188 B1 | * | 5/2001 | Aoki et al. .................. | 257/404 |
| 6,538,916 B2 | | 3/2003 | Ohsawa | |
| 6,545,318 B1 | * | 4/2003 | Kunikiyo .................... | 257/349 |
| 6,548,848 B2 | | 4/2003 | Horiguchi et al. | |
| 2006/0049444 A1 | | 3/2006 | Shino | |

FOREIGN PATENT DOCUMENTS

| | | |
|---|---|---|
| JP | 2002-246571 | 8/2002 |
| JP | 2002-343886 | 11/2002 |
| JP | 2005-158869 | 6/2005 |

OTHER PUBLICATIONS

U.S. Appl. No. 11/616,124, filed Dec. 26, 2006, Shino.

* cited by examiner

*Primary Examiner*—Wai-Sing Louie
(74) *Attorney, Agent, or Firm*—Oblon, Spivak, McClelland, Maier & Neustadt, P.C.

(57) ABSTRACT

A semiconductor memory device includes transistors, each including a first-conductivity-type semiconductor layer formed on a semiconductor substrate via a first insulating film, a second-conductivity-type source/drain regions formed in the semiconductor layer, a first-conductivity-type body region formed between the source region and the drain region in the semiconductor layer, the body region being electrically floating, and a gate electrode formed on a surface of a central portion of the body region via a second insulating film. In a section along a word line, which connects the gate electrodes together, a length of a boundary between the central portion of the body region and the second insulating film is smaller than a length of a boundary between the body region and the first insulating film. A second-conductivity-type counter impurity is doped in a surface portion of the central portion of the body region on which the second insulating film is formed.

14 Claims, 34 Drawing Sheets

DRAM100

FLOATING BODY-TYPE DRAM CELL WITH INCREASED CAPACITANCE

CROSS REFERENCE TO RELATED APPLICATION

This application is based upon and claims benefit of priority under 35 USC §119 from the Japanese Patent Application No. 2004-262320, filed on Sep. 9, 2004, the entire contents of which are incorporated herein by reference.

BACKGROUND OF THE INVENTION

The present invention relates to a semiconductor device and a method of fabricating the same.

Semiconductor memories such as DRAMs are more and more down-scaled in recent years. 1T-1C (1 Transistor-1 Capacitor) type DRAM, however, needs a certain area for the capacitor to ensure a storage capacitance of the capacitor. This limits the degree of down-scaling of the 1T-1C DRAM.

Also, since a capacitor must be formed in the 1T-1C DRAM, the fabrication process complicates, and the cost increases.

To solve these problems, a technique which forms a DRAM on an SOI (Silicon On Insulator) substrate is developed. For example, patent reference 1 or 2 (to be described later) discloses a DRAM formed by using an FBC (Floating Body Cell). The FBC is a memory cell formed by one transistor by using an SOI substrate.

This FBC is formed as a MOS transistor on an SOI substrate. A source region, drain region, and body region are formed in an SOI layer. The body region sandwiched between the source and drain regions is electrically floating, and data can be stored by charging or discharging this region.

In the FBC as described above, the data holding time prolongs and the yield increases as the capacitance between the body region and a fixed-potential element such as a support substrate increases.

In an FBC shown in FIG. 32 of patent reference 1, the capacitance between the body region and the support substrate is increased by using an SOI substrate having a thin buried oxide film (to be referred to as a BOX layer hereinafter).

On the other hand, in an FBC shown in FIG. 25 of patent reference 1, a back gate electrode is formed in a thick BOX layer to increase the capacitance between the body region and this back gate electrode.

Unfortunately, even when these structures are used, it is difficult to form an FBC having a sufficiently long data holding time and high yield.

References disclosing the conventional semiconductor memories are as follows.

1: Japanese Patent Laid-Open No. 2002-246571
2: Japanese Patent Laid-Open No. 2002-343886

SUMMARY OF THE INVENTION

According to one aspect of the invention, there is provided a semiconductor device comprising:
a plurality of transistors each having
a semiconductor substrate,
a first-conductivity-type semiconductor layer formed on said semiconductor substrate via a first insulating film, and having a single-crystal structure,
a second-conductivity-type source region and second-conductivity-type drain region formed in said semiconductor layer,
a first-conductivity-type body region formed between said source region and said drain region in said semiconductor layer, and floating, and
a gate electrode formed on a central portion of a surface of said body region via a second insulating film;
an element isolation insulating film which isolates said body regions in adjacent transistors of said plurality of transistors;
a word line which connects said gate electrodes of said plurality of transistors together;
a bit line electrically connected to said drain region; and
a source line electrically connected to said source region,
wherein in a section along said word line, an area in which said body region contacts said second insulating film is smaller than an area in which said body region contacts said first insulating film.

According to one aspect of the invention, there is provided a semiconductor device comprising:
a plurality of transistors each having
a semiconductor substrate,
a first-conductivity-type semiconductor layer formed on said semiconductor substrate via a first insulating film, and having a single-crystal structure,
a second-conductivity-type source region and second-conductivity-type drain region formed in said semiconductor layer,
a first-conductivity-type body region formed between said source region and said drain region in said semiconductor layer, and floating, and
a first gate electrode formed on a central portion of a surface of said body region via a second insulating film;
an element isolation insulating film which isolates said body regions in adjacent transistors of said plurality of transistors;
a word line which connects said first gate electrodes of said plurality of transistors together;
a bit line electrically connected to said drain region;
a source line electrically connected to said source region; and
a second gate electrode formed on said semiconductor substrate, below said body region in said plurality of transistors, so as to oppose said body region via a third insulating film,
wherein in a section along said word line, an area in which said body region contacts said second insulating film is smaller than an area in which said body region contacts said third insulating film.

According to one aspect of the invention, there is provided a method of fabricating a semiconductor device including a transistor having a first-conductivity-type semiconductor layer separated from a semiconductor substrate by a first insulating film and having a single-crystal structure, a gate electrode formed on the semiconductor substrate via a second insulating film, a second-conductivity-type source region and second-conductivity-type drain region formed in the semiconductor layer, and a body region positioned between the source region and the drain region, comprising the steps of:
forming a mask on the semiconductor layer formed on the semiconductor substrate via the first insulating film, and dividing the semiconductor layer by patterning using the mask, thereby partially exposing a surface of the first insulating film;

depositing an insulating film for element isolation so as to cover surfaces of the mask, semiconductor layer, and first insulating film;

planarizing the insulating film by using the mask as a stopper, and removing the mask, thereby covering corners at two ends of the surface of each of the divided semiconductor layers with a shoulder at one side of a T-shape of an element isolation insulating film made of the insulating film;

forming the second insulating film on a central portion of the surface of each semiconductor layer, which is not covered with the element isolation insulating film;

depositing and patterning an electrode material to form the gate electrodes on the semiconductor layers via the second insulating film, and forming a word line which connects the gate electrodes together; and ion-implanting an impurity in each semiconductor layer by using the gate electrode as a mask, thereby forming the second-conductivity-type source region and second-conductivity-type drain region at two end portions of each semiconductor layer, wherein an area in which the body region between the source region and the drain region in the semiconductor layer contacts the second insulating film is smaller than an area in which the body region contacts the first insulating film.

According to one aspect of the invention, there is provided a method of fabricating a semiconductor device including a transistor having a first-conductivity-type semiconductor layer separated from a semiconductor substrate by a first insulating film and having a single-crystal structure, a first gate electrode formed on the semiconductor substrate via a second insulating film, a second-conductivity-type source region and second-conductivity-type drain region formed in the semiconductor layer, a body region positioned between the source region and the drain region, and a second gate electrode formed on the semiconductor substrate so as to oppose the body region via a third insulating film, comprising the steps of:

forming, on the semiconductor layer formed on the semiconductor substrate via the first insulating film, a mask having an opening in a position where a word line formation region in which a word line which connects the first gate electrodes together is to be formed intersects an element isolation insulating film formation region in which an element isolation insulating film for isolating a plurality of transistors is to be formed;

patterning the first insulating film by using the mask as an etching stopper such that the first insulating film remains along the word line formation region below the source region and drain region in the semiconductor layer, thereby forming a hollow portion below the body region of the semiconductor device, and dividing the semiconductor layer into the plurality of transistors by patterning;

forming the third insulating film on a surface of the semiconductor layer in the hollow portion;

forming the second gate electrode, along the word line formation region, on the third insulating film in the hollow portion;

depositing an insulating film for element isolation so as to cover surfaces of the mask, semiconductor layer, and first insulating film;

planarizing the insulating film by using the mask as a stopper, and removing the mask, thereby covering corners at two ends of the surface of each of the divided semiconductor layers with a shoulder at one side of a T-shape of an element isolation insulating film made of the insulating film;

forming the second insulating film on a central portion of the surface of each semiconductor layer, which is not covered with the element isolation insulating film;

depositing and patterning an electrode material to form the gate electrodes on the semiconductor layers via the second insulating film, and forming a word line which connects the gate electrodes together; and ion-implanting an impurity in each semiconductor layer by using the gate electrode as a mask, thereby forming the second-conductivity-type source region and second-conductivity-type drain region at two end portions of each semiconductor layer, wherein an area in which the body region between the source region and the drain region in the semiconductor layer contacts the second insulating film is smaller than an area in which the body region contacts the third insulating film.

DETAILED DESCRIPTION OF THE INVENTION

First, the principle of an operation of writing data in an FBC will be described below.

Figure 84:
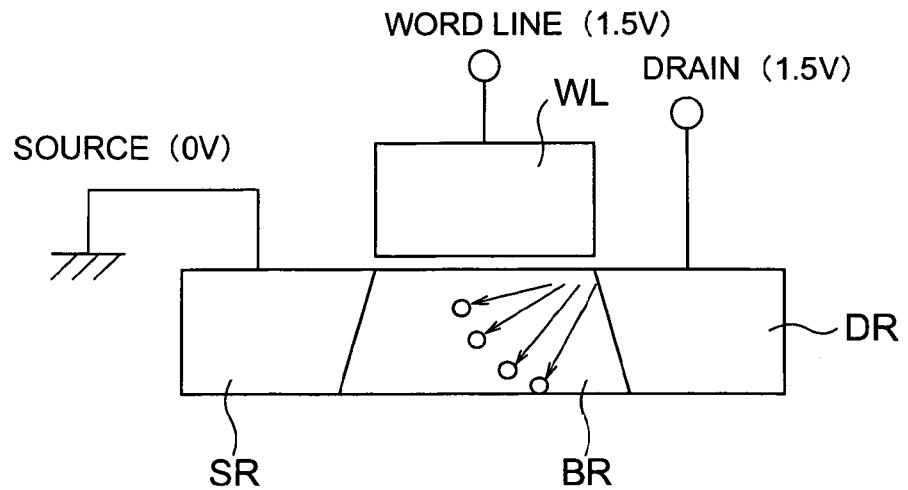
FIG. 84 is a view for explaining the principle when data "1" is written in an FBC.

The FBC is formed as a MOS transistor on an SOI substrate. As shown in FIG. 84, a source region SR, a drain region DR, and a body region BR between them are formed in an SOI layer. The body region BR sandwiched between the source region SR and the drain region DR is electrically floating. Data can be stored by charging or discharging the body region BR.

To write data "1" in the FBC, as shown in FIG. 84, 1.5 V and 1.5 or 2 V, for example, are applied to a word line WL and the drain region DR, respectively, thereby biasing the FBC to a saturated state. This induces impact ionization in the body region BR, and holes are stored in the body region BR. Data "1" is written when a large number of holes are stored in the body region BR and the body potential rises.

Figure 85:
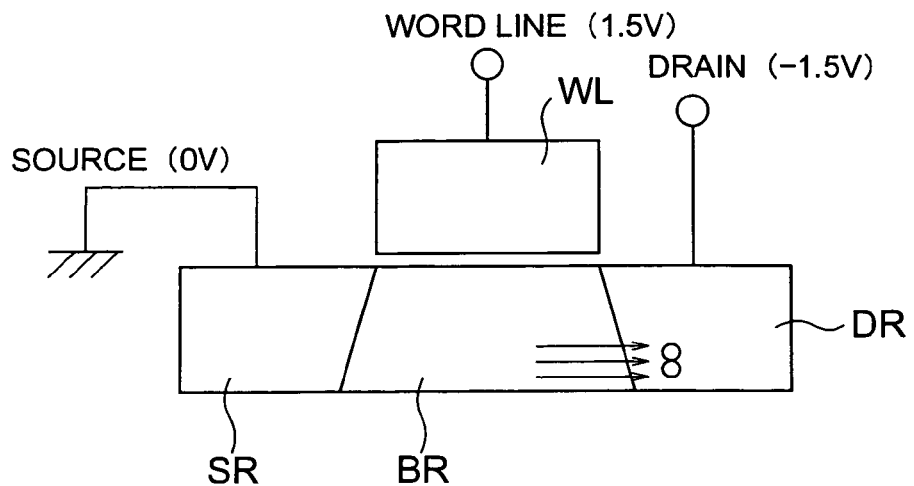
FIG. 85 is a view for explaining the principle when data "0" is written in the FBC.

To write data "0" in the FBC, as shown in FIG. 85, 1.5 V and −1 or −1.5 V, for example, are applied to the word line WL and drain region DR, respectively, thereby forwardly biasing a p-n junction between a p-type body region contained in the body region BR and an n-type drain region. This removes holes stored in the body region BR to the drain region DR. Consequently, the number of holes in the body region BR decreases, the potential of the body region BR lowers, and data "0" is written in the FBC.

Figure 86:
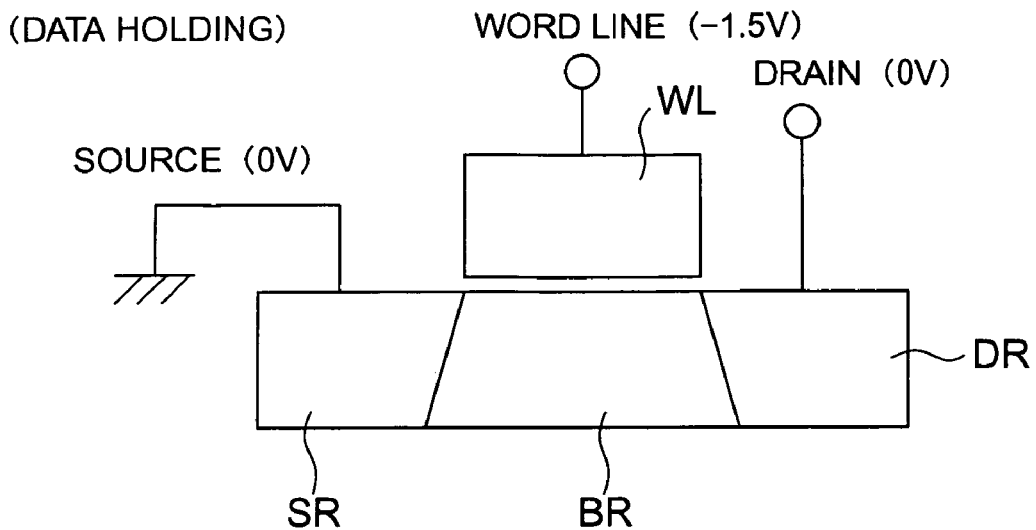
FIG. 86 is a view for explaining the principle when data written in the FBC is held.

To hold the body potentials corresponding to data "0" and data "1", as shown in FIG. 86, −1.5 V, for example, are applied as a negative potential to the word line WL, and the drain region DR is set at 0 V.

To read out data from the FBC, 0.2 V are applied to the drain region DR, and 1.5 V, for example, are applied to the word line WL to detect a drain current I.

Figure 87:
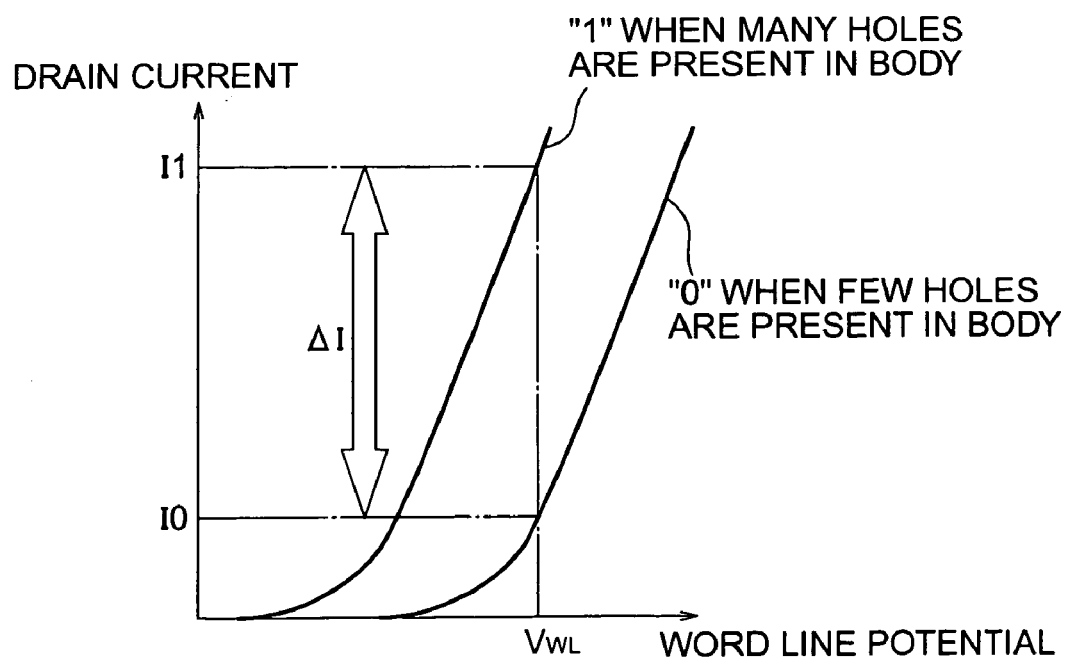
FIG. 87 is a graph showing the difference between drain currents when data "1" and "0" are written in the FBC.

As shown in FIG. 87, data "0" and data "1" can be distinguished from each other by a difference ΔI between a drain current I0 when the body potential corresponding to data "0" is held and a drain current I1 when the body potential corresponding to data "1" is held.

Generally, in the FBC as described above, the data holding time prolongs and the yield increases as the capacitance between the body region BR and a fixed-potential element such as a support substrate increases.

Semiconductor devices according to embodiments of the present invention will be described below with reference to the accompanying drawings.

(1) Semiconductor Device According to First Embodiment

Figure 1:
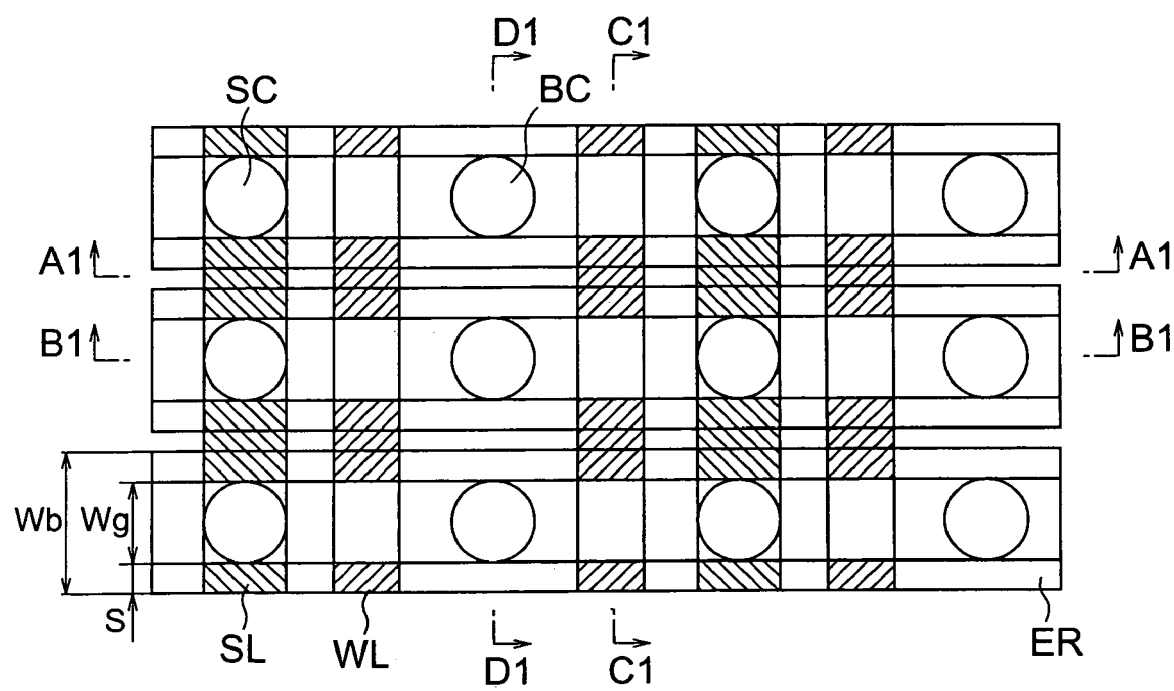
FIG. 1 is a plan view showing the planar arrangement of a semiconductor device according to the first embodiment of the present invention.

FIG. 1 shows the planar arrangement of a DRAM 100 as a semiconductor device according to the first embodiment of the present invention.

A peripheral circuit for controlling the DRAM 100 can also be formed in the periphery of the DRAM 100. The DRAM 100 includes word lines WL, source lines SL, and bit lines BL (not shown).

The word lines WL and source lines SL run substantially parallel to each other, and the bit lines BL run in a direction substantially perpendicular to the word lines WL and source lines SL.

Bit line contacts BC which electrically connect the bit lines BL (not shown) and drain regions (not shown) are formed below the bit lines BL.

Figure 2:
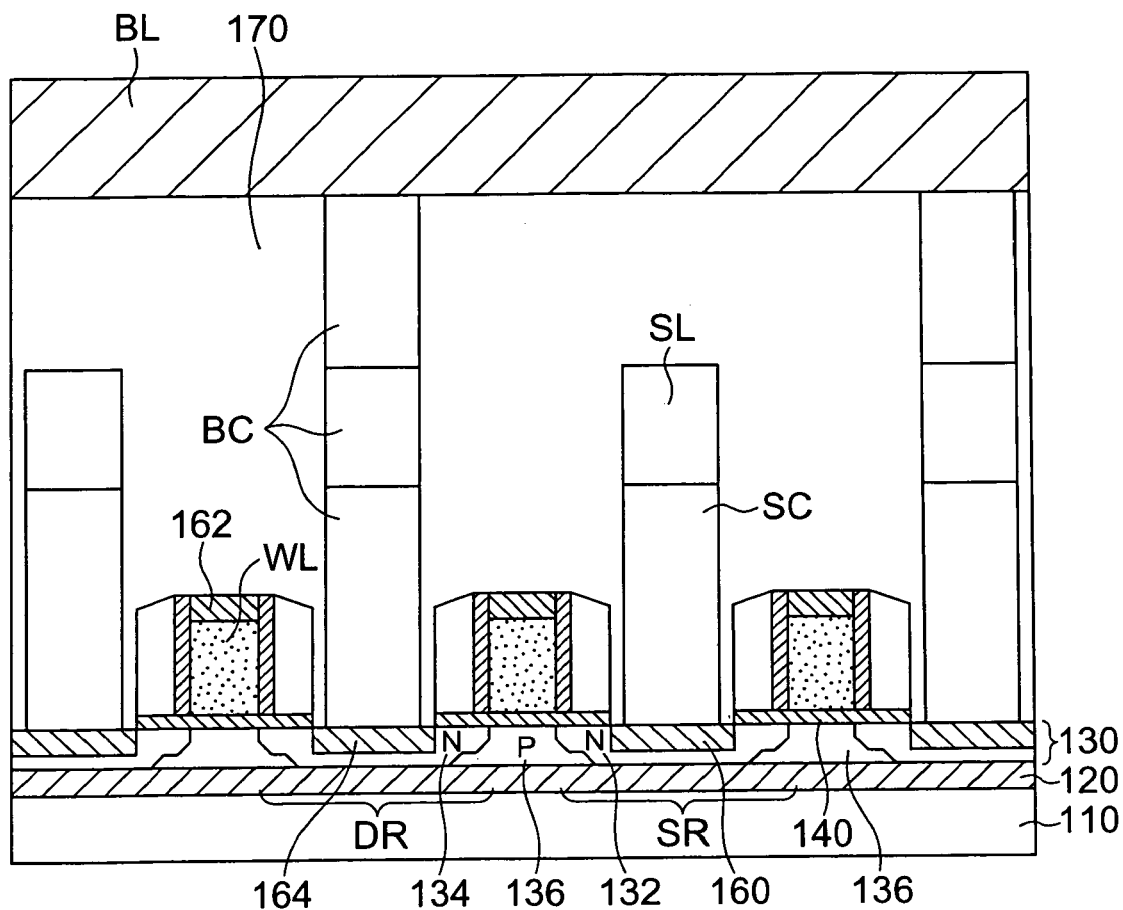
FIG. 2 is a longitudinal sectional view showing a sectional structure taken along a line B1-B1 in FIG. 1.
Figure 3:
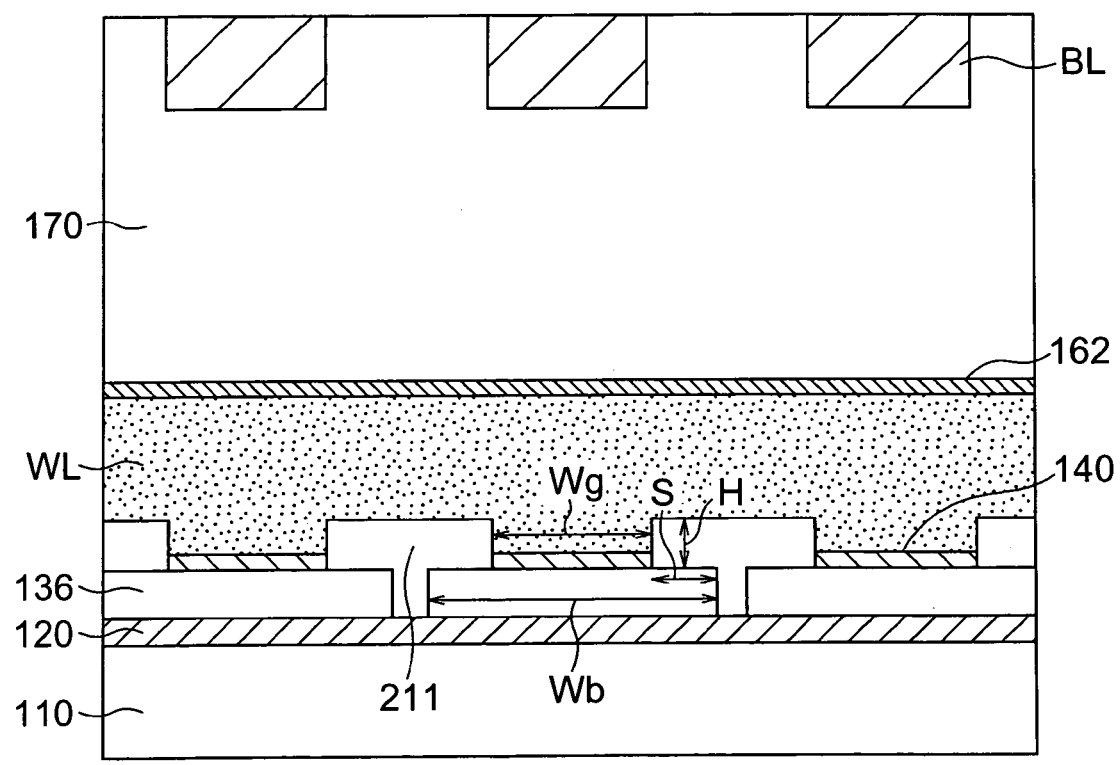
FIG. 3 is a longitudinal sectional view showing a sectional structure taken along a line C1-C1 in FIG. 1.

FIG. 2 shows a longitudinal sectional structure when an element region ER shown in FIG. 1 is cut along a line B1-B1. FIG. 3 shows a longitudinal sectional structure when the word line WL shown in FIG. 1 is cut along a line C1-C1.

Figure 4:
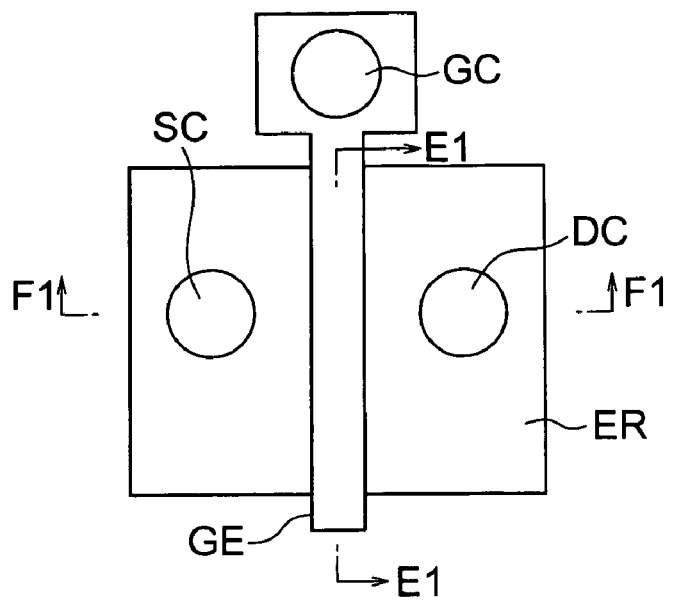
FIG. 4 is a plan view showing the planar arrangement of a peripheral logic circuit of the same semiconductor device.
Figure 5:
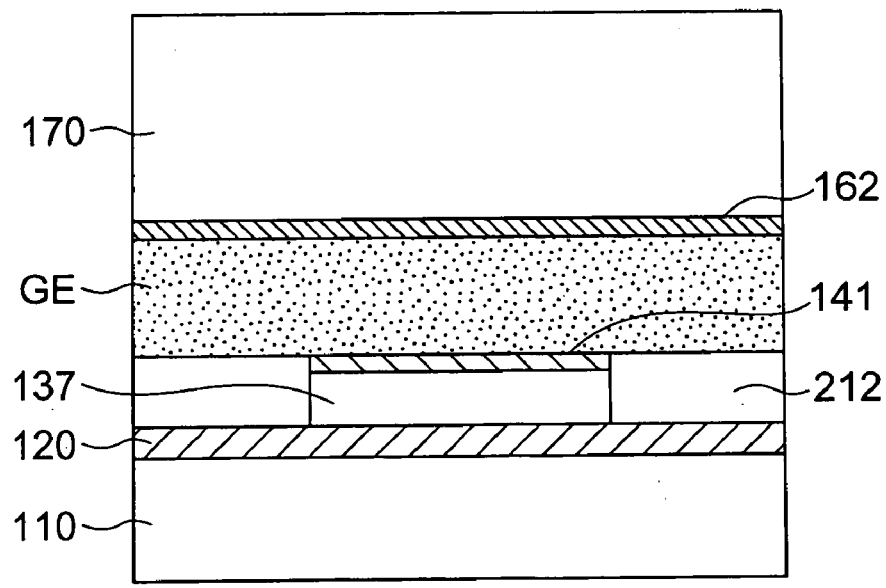
FIG. 5 is a longitudinal sectional view showing a sectional structure taken along a line F1-F1 in FIG. 4.

Also, FIG. 4 shows the planar arrangement of an N-channel MOS transistor in the region of a peripheral circuit or logic circuit (to be referred to as a peripheral logic circuit hereinafter). FIG. 5 shows a longitudinal sectional structure when a gate electrode shown in FIG. 4 is cut along a line E1-E1.

A source region and drain region are formed in the two end portions of the element region ER, and a gate electrode GE is formed on a channel region between these source and drain regions via a gate insulating film. In an interlayer dielectric film 170, a source contact SC, drain contact DC, and gate contact GC (none of them is shown) are formed on the source region, drain region, and gate electrode GE, respectively.

The longitudinal sectional structure, along the word line WL, of the FBC included in the DRAM according to the first embodiment will be explained below with reference to FIG. 3.

A body region 136 is formed on a support substrate 110 via a buried oxide film (to be referred to as a BOX layer hereinafter) 120 (an example of a first insulating film). A first gate insulating film 140 (an example of a second insulating film) is formed on the upper surface of the body region 136. The gate insulating film on the upper surface of the body region in this FBC is the first gate insulating film 140, and the gate insulating film in the peripheral circuit is a second gate insulating film 141.

The body region 136 except for the first gate insulating film 140 is covered with an STI oxide film 211 (an example of an element isolation insulating film) having a T-shape, a height H and a shoulder width S.

The word line WL is formed on the upper surfaces of the first gate insulating film 140 and STI oxide film 211.

A silicide film 162 for reducing the resistance is formed on the upper surface of the word line WL, and the interlayer dielectric film 170 is formed on the silicide film 162. The bit lines BL are formed in the surface portion of the interlayer dielectric film 170 in the direction perpendicular to the paper.

In this embodiment, the STI oxide film 211 having a large thickness (height H) is formed, and this reduces the capacitance (to be referred to as Cg hereinafter) between the body region 136 of the FBC and the word line WL. Accordingly, it is possible to increase the ratio of the capacitance (to be referred to as Csub hereinafter) between the body region 136 and the support substrate 110 to the capacitance Cg.

This facilitates distinguishing between data "1" and data "0", and realizes a DRAM having a high yield and a long data holding time.

When this FBC region is compared with the peripheral logic circuit region shown in FIGS. 4 and 5, the height of an STI oxide film 212 with respect to a body region 137 in the peripheral logic circuit is smaller than that of the STI oxide film 211 in the FBC region, in the section along the gate electrode GE.

This makes it possible to eliminate residual polysilicon when the gate electrode material is etched in the peripheral logic circuit region, and provide a DRAM having a high yield.

Note that the body region 137 in a transistor of the peripheral logic circuit is not necessarily electrically floating.

The longitudinal sectional structure, along the bit line BL, of the FBC shown in FIG. 2 will be described below. An n-type source region 132 and n-type drain region 134 are formed in an SOI layer 130, and the p-type body region 136 is formed between the source region 132 and the drain region 134.

The first gate insulating film 140 (an example of a second insulating film) is formed on the p-type body region 136, and the word line WL is formed on the first gate insulating film 140. The word line WL is insulated from the body region 136 by the first gate insulating film 140.

The first gate insulating film 140 is made of, e.g., $SiO_2$.

The film thickness of the BOX layer 120 (an example of a first insulating film) is, e.g., 5 to 25 nm. The film thickness of the body region 136 is, e.g., 75 nm.

A suicide 160 is formed on the surface of the source region 132 in contact with the source contact SC, thereby reducing the contact resistance.

The upper surface of the word line WL is covered with the silicide 162, and this reduces the resistance of the word line WL.

A silicide 164 is formed on the surface of the drain region 134 in contact with the bit line contact BC, thereby reducing the contact resistance.

A gap between the word line WL and the bit line BL is filled with the interlayer dielectric film 170 made of an insulating material such as $SiO_2$.

Furthermore, as shown in FIG. 3, in the longitudinal sectional structure along the word line WL, the STI oxide film 211 is formed in the front and rear of the body region 136. The STI oxide film 211 is made of an insulating material such as $SiO_2$.

In this structure, the body region 136 is electrically floating because it is surrounded by the insulating material and the semiconductor materials different in conductivity type.

The potential of the body region 136, therefore, changes in accordance with the potentials of the support substrate 110, word line WL, source region 132, and drain region 134.

Figure 6:
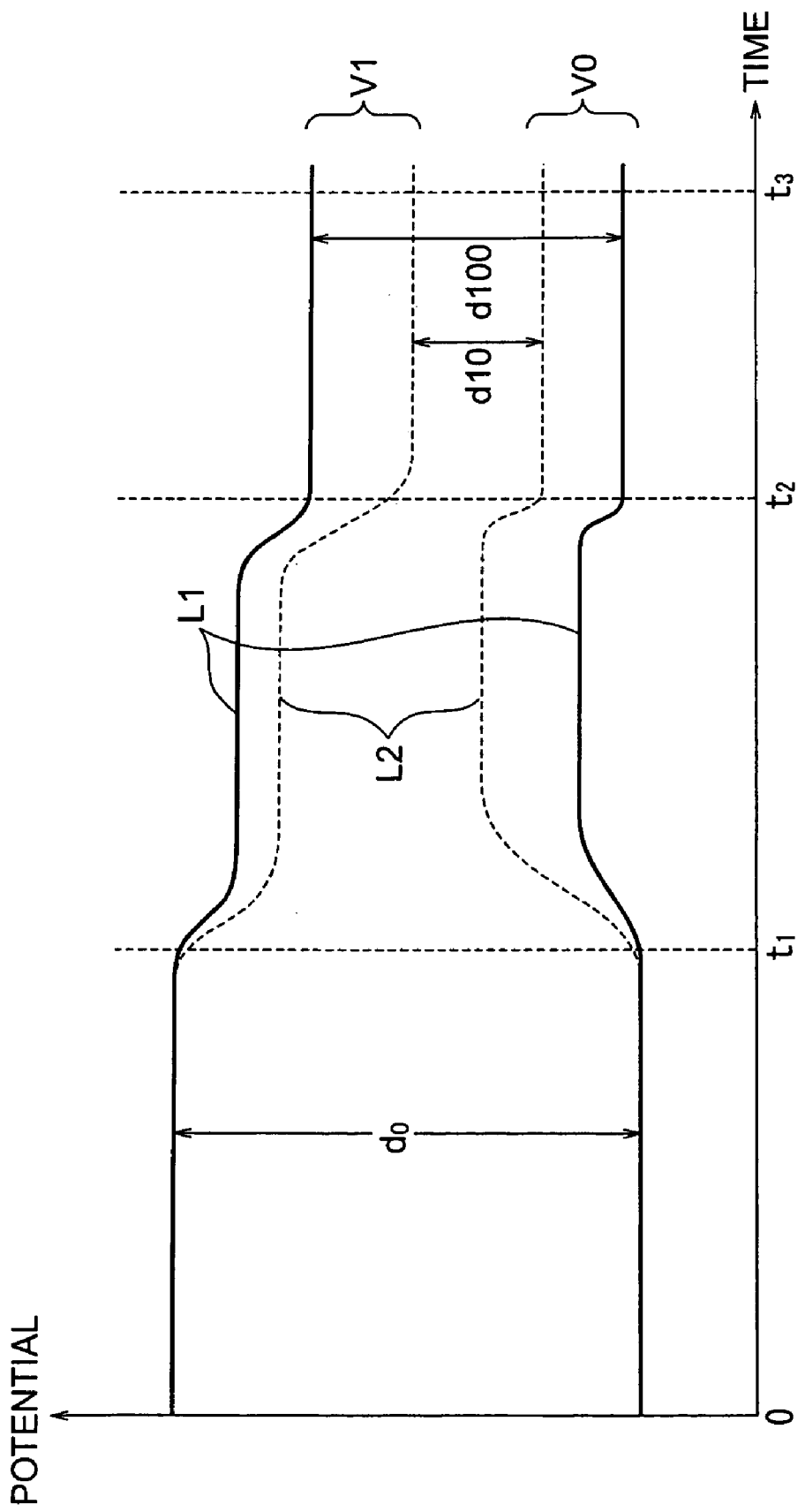
FIG. 6 is a graph showing changes in potential when data is written and held in the same semiconductor device.

FIG. 6 shows the potential (to be referred to as a body potential hereinafter) of the body region 136 when data "1" or data "0" is written and held.

V1 denotes the body potential for data "1"; and V0, the body potential for data "0". The abscissa indicates the time.

From time 0 to time t1, data "1" is written in a certain body region 136 by setting the potentials of the word line WL and bit line BL at, e.g., 1.5 V, and data "0" is written in another body region 136 by setting the potential of the word line WL at, e.g., 1.5 V, and the potential of the bit line BL at, e.g., −1.5 V.

At time t1, the bit line BL is returned to the holding state (e.g., 0 V).

At time t2, the word line WL is returned to the holding state (e.g., −1.5 V).

Of curves indicated by the body potentials V1 and V0, curves L2 indicated by the broken lines represent the body potentials of a conventional DRAM (to be referred to as a DRAM 10 for the sake of convenience) not including the STI oxide film 211 of this embodiment, and curves L1 indicated by the solid lines represent the body potentials of the DRAM 100 according to the first embodiment.

During data write from time 0 to time t1, the body potentials of the DRAM 10 and DRAM 100 are substantially the same.

In this state, the body potential difference between data "1" and data "0" is large, so these data can be readily distinguished from each other.

When the bit line BL is returned to the holding state from time t1 to time t2, however, the body potential V1 lowers, and the body potential V0 rises. Accordingly, the body potential difference between data "1" and data "0" decreases.

Furthermore, when the word line WL is returned to the holding state from time t2 to time t3, the body potential V0 lowers, and the body potential V1 lowers more than the body potential V0. This further decreases the body potential difference between data "1" and data "0".

As is apparent from this graph shown in FIG. 6, in the conventional DRAM 10, a body potential difference d0 between data "1" and data "0" at time t1 lowers to a potential difference d10. In the DRAM 100 according to the first embodiment, the body potential difference d0 lowers to a potential difference d100.

The potential difference d100 of the DRAM 100 of this embodiment is larger than the potential difference d10 of the conventional DRAM 10.

Generally, the larger the difference between the body potentials V1 and V0, the more easily data "1" and data "0" are distinguished from each other, and the higher the yield.

Accordingly, the DRAM 100 of this embodiment facilitates distinguishing between data "1" and data "0" and increases the yield, compared to the conventional DRAM 10.

The reason is as follows. In the DRAM 100 of this embodiment, as shown in FIG. 3, the STI oxide film 211 makes that area of the bottom surface of the body region 136, which opposes the support substrate 110 larger than that area of the upper surface of the body region 136, which opposes the word line WL. That is, in the section along the word line, a width Wb of the bottom portion of the body region is larger by width S×2 than a channel width Wg. Therefore, a ratio Csub/Cg of the capacitance Csub between the support substrate 110 and the body region 136 to the capacitance Cg between the body region 136 and the word line WL is higher than the capacitance ratio Csub/Cg of the conventional DRAM 10.

This reason will be explained in more detail below. Letting Csub denote the capacitance between the support substrate 110 and the body region 136, Cd denote the capacitance between the drain region 134 and the body region 136, Cs denote the capacitance between the source region 132 and the body region 136, and Cg denote the capacitance between the word line WL and the body region 136.

A ratio R at which the capacitance Csub between the support substrate 110 and the body region 136 contributes to the body region 136 is represented by Csub/(Csub+Cd+Cs+Cg).

A negative fixed potential is given to the support substrate 110. Therefore, if Csub greatly contributes to the body region 136, the body potentials V1 and V0 become more stable.

Accordingly, the higher the ratio R, i.e., the larger the capacitance Csub, the more stable the body potentials V1 and V0.

As a consequence, even after the bit line BL and word line WL are returned to the holding state after time t2 shown in FIG. 6, the potential difference d100 in the DRAM 100 of this embodiment is maintained close to the potential difference d0 during data write from time 0 to time t1.

For example, the potential difference between the body potentials V1 and V0 is about 1.5 V during data write. However, after the bit line BL is returned to the holding state after time t1, the body potential difference (V1−V0) is about 1.5 V×(Csub/(Csub+Cd+Cs+Cg)).

If the ratio at which Cg contributes to the body region 136 is high, the potential difference between data "1" and data "0" largely decreases when the word line WL is returned to the holding state (from time t2 to time t3).

For example, the decrease in body potential V1 is larger by 1.5 V×(Cg/(Csub+Cd+Cs+Cg)) than that in body potential V0.

This is so because the transistor threshold voltage for data "1" differs by 1.5 V from that for data "0", and so the degrees of capacitance coupling between the word line WL and the body region 136 have a difference of 1.5 V.

This expression (1.5 V×(Cg/(Csub+Cd+Cs+Cg))) also indicates that the body potential difference (V1−V0) is increased by decreasing the capacitance Cg between the word line WL and the body region 136.

Each of the DRAM 100 of this embodiment and the conventional DRAM 10 has a BOX layer about 25 nm thick. In the DRAM 100 of this embodiment, however, the contact area between the body region 136 and the support substrate 110 increases, and this makes Csub of the DRAM 100 larger than that of DRAM 10. Accordingly, the potential difference d100 in the DRAM 100 of this embodiment is larger than the potential difference d10 in the conventional DRAM 10.

The individual capacitances described above will be estimated in detail below.

Referring to FIG. 3, assume that the channel width Wg is 100 nm, the width of the STI oxide film 211 is 100 nm, and a width (gate length) L of the word line WL is 100 nm.

Assume also that the impurity concentration in the body region 136 is $1 \times 10^{18}$ cm$^{-3}$, the film thickness of the BOX layer 120 is 25 nm, the film thickness of the gate insulating film 140 is 5 nm, and the film thickness of the body region 136 is 75 nm.

In the conventional DRAM 10 in which the corners of the upper surface of the body region 136 are not covered with the STI oxide film 211 having a T-shape according to this embodiment, both the capacitances Cd and Cs are 0.021 fF.

The capacitance Csub is 0.014 fF. The depletion layer capacitance below the channel is 0.03 fF, the capacitance of the gate insulating film is 0.069 fF, and the capacitance Cg obtained by connecting these two capacitances in series is 0.021 fF.

In this structure, the value (0.014 fF) of Csub is smaller than Cd, Cs, and Cg (each of which is 0.021 fF).

The capacitance Csub is proportional to the width Wb and first gate length L of the body region 136, and inversely proportional to a film thickness Tbox of the BOX layer 120.

That is, a relation Csub ∝ body region width Wb×first gate length L/BOX layer film thickness Tbox holds.

On the other hand, the capacitances Cs and Cd are proportional to the width Wb of the body region and a film thickness Tsoi of the SOI layer, respectively. That is, $$Cs \propto Wb \times Tsoi$$

$$Cd \propto Wb \times Tsoi$$

Also, the capacitance Cg is proportional to the channel width Wg, the first gate length L, and a first gate capacitance Cgo ($0.021 \times 10^{-4}$ fF/nm$^2$) per unit area.

That is, $$Cg \propto Wg \times L \times Cgo$$

By using the above numerical values and expressions, it is possible to increase the ratio of contribution of the capacitance Csub, and thereby increase the body potential difference d100.

For example, letting Tbox denote the film thickness of the BOX layer 120, Csub can be made larger than Cd and Cs by satisfying $$Tsoi \times Tbox/L < 12.5 \text{ nm} \quad (1)$$

Also, Csub can be made larger than Cg by satisfying $$Tbox \times Cgo \times Wg/Wb < 3.5 \times 10^{-5}/\text{nm} \quad (2)$$

In the conventional DRAM 10, the channel width Wg and the width Wb of the body region are equal. To make the contribution ratio of Csub higher than that of Cg, therefore, it is necessary to decrease the film thickness of the BOX layer, or increase the thickness of the first gate insulating film.

If the film thickness of the BOX layer is decreased, however, the parasitic capacitance of the peripheral logic circuit increases, and this increases the power consumption of the circuit or decrease the speed of the circuit.

When the first gate insulating film is made thick, the FBC drain current greatly varies to decrease the yield.

The DRAM 100 of this embodiment, therefore, has a structure in which the STI oxide film 211 covering the corners of the upper surface of the body region 136 makes the width Wg of the channel region smaller than the width Wb of the body region.

For example, if the DRAM 100 has a shoulder width S of 25 nm, Wg is 100 nm, i.e., the same value as in the conventional device, whereas the width Wb of the body region in the interface of the BOX layer is 150 nm.

In this structure, the capacitance Csub is 1.5 times that of the conventional DRAM 10, i.e., 0.021 fF.

That is, expression (2) presented earlier is satisfied by making the shoulder width S larger than 25 nm.

More specifically, the shoulder width S on one side is increased to about 25% or more of the channel width Wg. This facilitates distinguishing between data "0" and data "1", and extends the data holding time.

The height H of the STI oxide film 211 is 10 times or more the film thickness of the gate insulating film 140, i.e., at least 50 nm.

This makes it possible to decrease the capacitance coupling formed between the first gate and the body region 136 via the STI oxide film 211 at the corners of the upper surface of the body region 136.

Also, if the DRAM 100 has an SOI film thickness of 50 nm, the capacitances Cd and Cs are 0.021 fF.

That is, expression (1) presented earlier is satisfied by making the SOI film thickness smaller than 50 nm.

Note that the impurity concentration in the body region 136 is $1 \times 10^{18}$ cm$^{-3}$.

When a gate voltage equal to or higher than the threshold voltage is applied to this transistor, a depletion layer width formed below the channel, i.e., a so-called maximum depletion layer width is about 35 nm.

Accordingly, when the SOI film thickness is equal to or larger than 35 nm, the FBC is a so-called "partially-depleted device", i.e., a device in which the body is not entirely depleted and a neutral region is formed on the bottom.

For example, if the impurity concentration in the body region is $1 \times 10^{17}$ cm$^{-3}$, the thickness of the depletion layer formed below the channel is about 100 nm.

In this case, an FBC having an SOI film thickness of 100 nm or less is a so-called "fully-depleted device", i.e., a device in which the entire body is depleted.

The fully-depleted device can perform the FBC operation described above by sufficiently pulling the potential of the body bottom portion toward the negative side by applying a negative voltage to the support substrate, i.e., by setting the body bottom portion in a surface accumulation state.

Accordingly, the capacitance Csub plays an important role even in this fully-depleted device, so the data holding time can be extended by the FBC structure according to this embodiment.

(2) Method of Fabricating Semiconductor Device According to First Embodiment

A method of fabricating the semiconductor device (DRAM 100) according to the first embodiment of the present invention will be described below with reference to FIGS. 7 to 25 showing the sections of elements in different steps.

Figure 7:
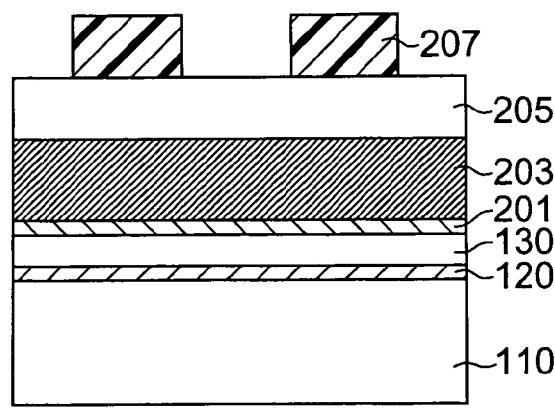
FIG. 7 is a longitudinal sectional view showing a section taken along the line C1-C1 in FIG. 1, as the sectional structure of an element in one step of a method of fabricating the same semiconductor device.
Figure 8:
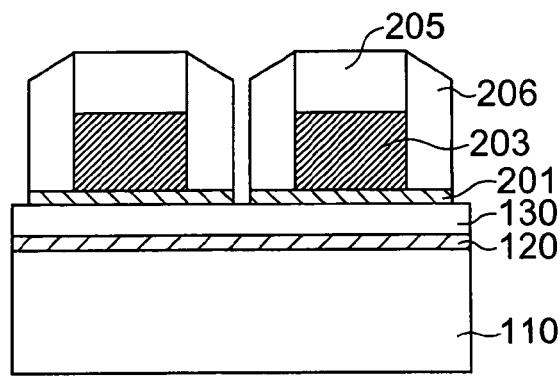
FIG. 8 is a longitudinal sectional view showing a section taken along the line C1-C1 in FIG. 1, as the sectional structure of an element in one step of a method of fabricating the same semiconductor device.
Figure 9:
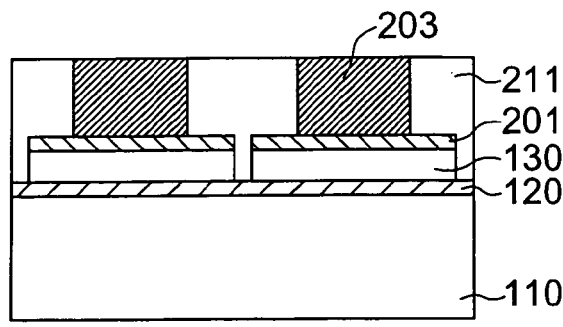
FIG. 9 is a longitudinal sectional view showing a section taken along the line C1-C1 in FIG. 1, as the sectional structure of an element in one step of a method of fabricating the same semiconductor device.

FIGS. 7 to 9 are sectional views each showing the element structure of a longitudinal section taken along the word line WL along the line C1-C1 in FIG. 1.

Of FIGS. 10 to 25, each of FIGS. 10, 12, 14, 18, and 22 shows the longitudinal sectional structure of the FBC taken along the word line WL along the line C1-C1 in FIG. 1.

Figure 16:
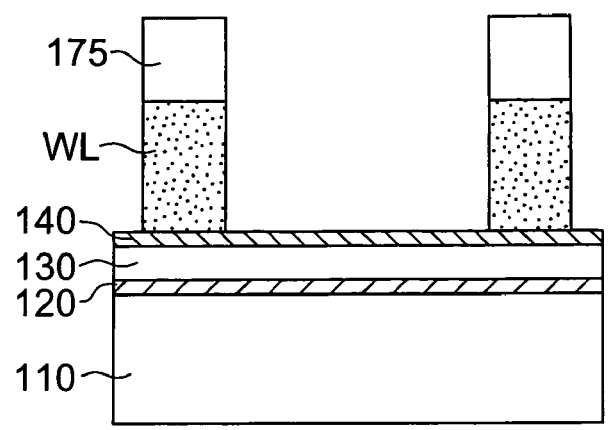
FIG. 16 is a longitudinal sectional view showing a section taken along the line B1-B1 in FIG. 1, as the sectional structure of an element in one step of a method of fabricating the same semiconductor device.
Figure 20:
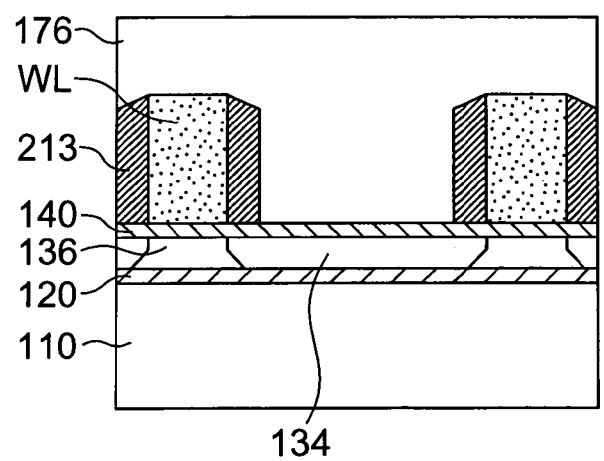
FIG. 20 is a longitudinal sectional view showing a section taken along the line B1-B1 in FIG. 1, as the sectional structure of an element in one step of a method of fabricating the same semiconductor device.
Figure 24:
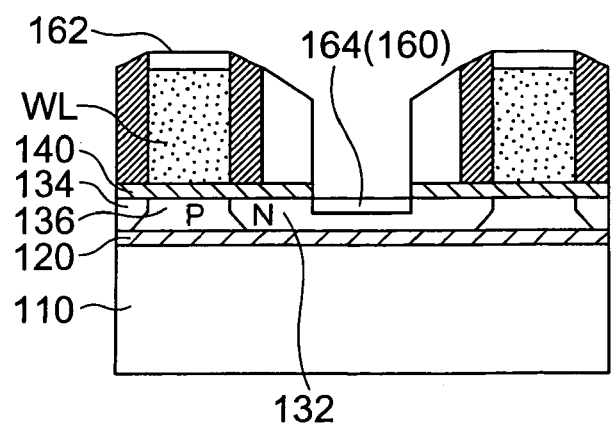
FIG. 24 is a longitudinal sectional view showing a section taken along the line B1-B1 in FIG. 1, as the sectional structure of an element in one step of a method of fabricating the same semiconductor device.

Each of FIGS. 16, 20, and 24 shows the longitudinal section of the FBC taken along the element region ER along the line B1-B1 in FIG. 1.

Each of FIGS. 11, 13, 15, 19, and 23 shows a longitudinal section along the gate electrode of an N-channel transistor included in the peripheral logic circuit taken along the line E1-E1 in FIG. 4.

Figure 17:
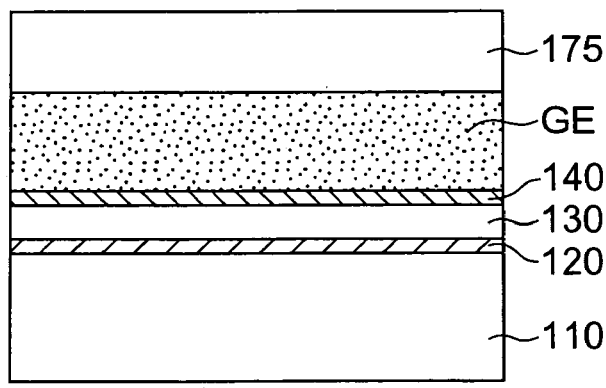
FIG. 17 is a longitudinal sectional view showing a section taken along the line F1-F1 in FIG. 1, as the sectional structure of an element in one step of a method of fabricating the same semiconductor device.
Figure 21:
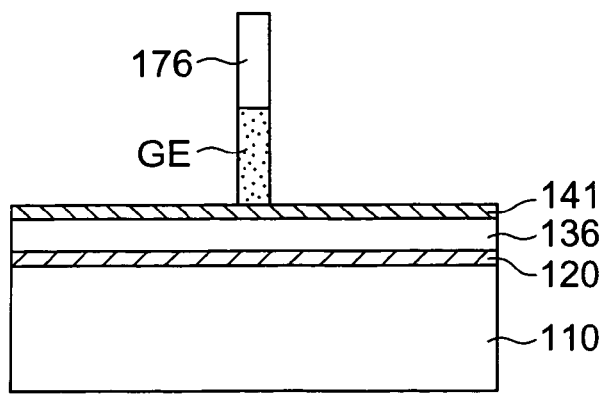
FIG. 21 is a longitudinal sectional view showing a section taken along the line F1-F1 in FIG. 1, as the sectional structure of an element in one step of a method of fabricating the same semiconductor device.
Figure 22:
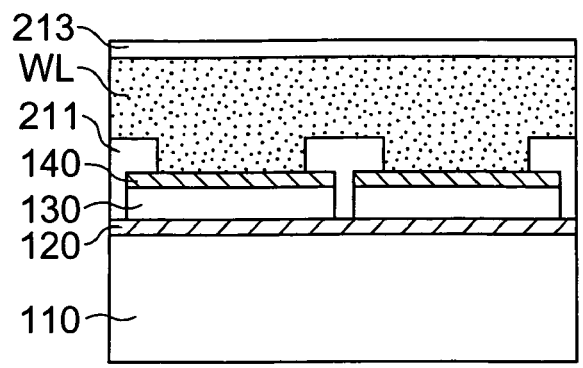
FIG. 22 is a longitudinal sectional view showing a section taken along the line C1-C1 in FIG. 1, as the sectional structure of an element in one step of a method of fabricating the same semiconductor device.
Figure 23:
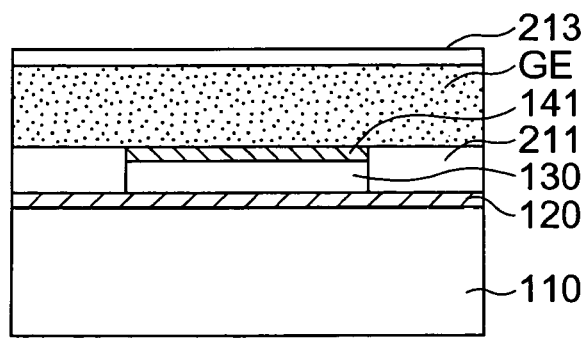
FIG. 23 is a longitudinal sectional view showing a section taken along the line E1-E1 in FIG. 1, as the sectional structure of an element in one step of a method of fabricating the same semiconductor device.
Figure 25:
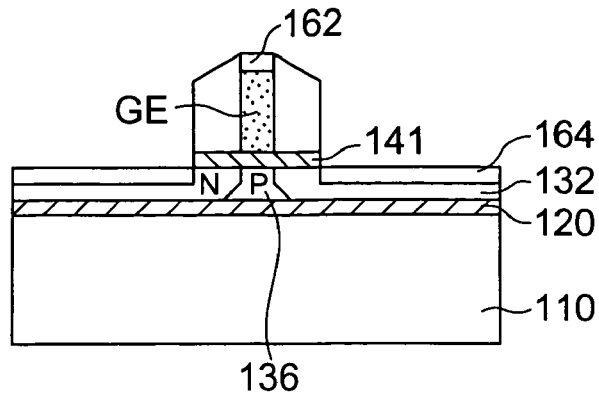
FIG. 25 is a longitudinal sectional view showing a section taken along the line F1-F1 in FIG. 1, as the sectional structure of an element in one step of a method of fabricating the same semiconductor device.

Each of FIGS. 17, 21, and 25 shows a longitudinal section including the source contact SC and drain contact DC taken along a line F1-F1 in FIG. 4.

First, as shown in FIG. 7, an SOI substrate having a support substrate 110, BOX layer 120, and SOI layer 130 is prepared.

The thickness of the BOX layer 120 is 25 nm, and that of the SOI layer 130 is 60 nm.

A silicon oxide film 201 is formed by oxidizing the upper surface of the SOI layer 130.

CVD or the like is used to deposit a silicon nitride film 203 on the silicon oxide film 201, and a silicon oxide film 205 on the silicon nitride film 203.

The silicon oxide film 205 is coated with a resist, and this resist is patterned by using photolithography to form a resist film 207.

As shown in FIG. 8, the resist film 207 is used as a mask to etch the silicon oxide film 205, silicon nitride film 203, and silicon oxide film 201 by RIE or the like.

A silicon oxide film 206 is then deposited. The film thickness of the silicon oxide film 206 is adjusted not to fill the spacing between the nitride films 203 with the silicon oxide film 206.

For example, when the spacing between the silicon nitride films 203 is 200 nm, the film thickness of the silicon oxide film 206 is 80 nm.

The silicon oxide film 206 is etched by RIE or the like.

As shown in FIG. 9, the SOI layer 130 is etched by using the silicon oxide films 205 and 206 as masks by RIE or the like.

Then, the silicon oxide films 205 and 206 are selectively removed. After that, a silicon oxide film 211 is deposited so as to fill the spacings between the adjacent SOI layers 130 by using CVD or the like.

CMP or the like is used to polish the silicon oxide film 211 and planarize its upper surface by using the silicon nitride film 203 as a stopper.

Figure 10:
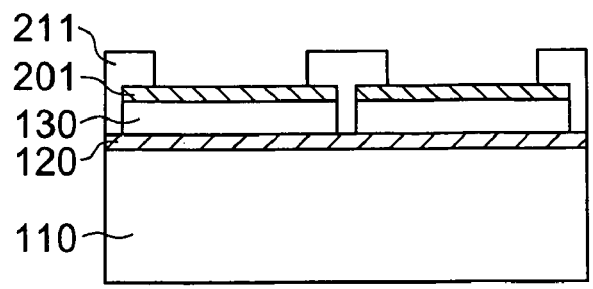
FIG. 10 is a longitudinal sectional view showing a section taken along the line C1-C1 in FIG. 1, as the sectional structure of an element in one step of a method of fabricating the same semiconductor device.
Figure 11:
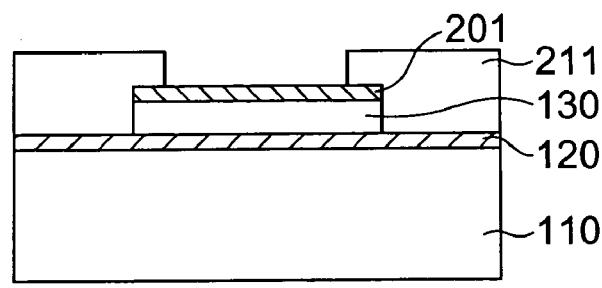
FIG. 11 is a longitudinal sectional view showing a section taken along the line E1-E1 in FIG. 1, as the sectional structure of an element in one step of a method of fabricating the same semiconductor device.

As shown in FIGS. 10 and 11, the silicon nitride film 203 as an etching stopper is removed.

A resist film (not shown) having an opening in an FBC formation region is formed. This resist film is used as a mask to ion-implant boron at an acceleration energy of 130 keV and a dose of $1 \times 10^{14}$ cm$^{-2}$. In addition, boron is ion-implanted at an acceleration energy of 10 keV and a dose of $1 \times 10^{13}$ cm$^{-2}$, and the resist film is removed.

Annealing is then performed for about 10 min in a nitrogen ambient at 1,200° C. Consequently, boron having an impurity concentration of about $1 \times 10^{18}$ cm$^{-3}$ evenly distributes in the FBC formation region in the SOI layer 130.

Simultaneously, boron having a concentration of about $1 \times 10^{18}$ cm$^{-3}$ evenly distributes in the FBC formation region in the support substrate 110.

The boron diffusion layer formed in the support substrate 110 extends outside the cell array. This boron diffusion layer is connected to an interconnection by a contact plug (not shown) formed on the diffusion layer, and given a fixed voltage.

After that, an appropriate impurity is doped in the SOI layer and support substrate in an n-channel MOS transistor region and p-channel MOS transistor region in a peripheral logic circuit. RTA (Rapid Thermal Annealing) is then performed to activate the doped impurity.

Figure 12:
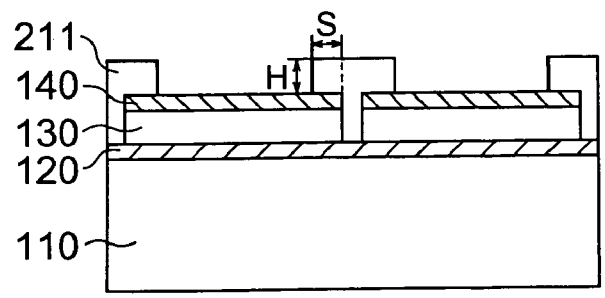
FIG. 12 is a longitudinal sectional view showing a section taken along the line C1-C1 in FIG. 1, as the sectional structure of an element in one step of a method of fabricating the same semiconductor device.
Figure 13:
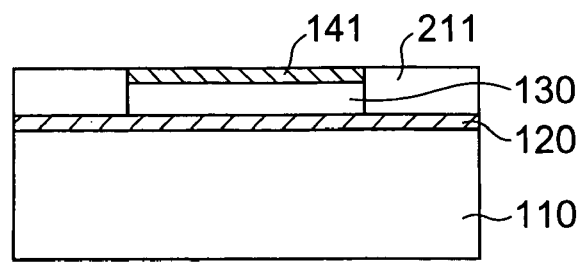
FIG. 13 is a longitudinal sectional view showing a section taken along the line E1-E1 in FIG. 1, as the sectional structure of an element in one step of a method of fabricating the same semiconductor device.

As shown in FIGS. 12 and 13, gate insulating films 140 and 141 are formed on the SOI 130. In this case, a resist pattern (not shown) having an opening in the peripheral logic circuit is formed, and the STI oxide film 211 is etched by ammonium fluoride.

In this stage, in the FBC formation region shown in FIG. 12, a height H and shoulder width S of the STI oxide film 211 are about 50 nm and 50 nm, respectively. These values depend upon the film thickness of the silicon oxide film 206.

On the other hand, in the peripheral logic circuit shown in FIG. 13, the height H and shoulder width S of the STI oxide film 211 are substantially 0.

In the FBC region shown in FIG. 12, the thickness of the first gate insulating film 140 is, e.g., 6 nm in order to increase the drain current difference.

On the other hand, in the peripheral logic circuit shown in FIG. 13, the thickness of the second gate insulating film 141 is very small, e.g., 1 nm, in order to increase the processing speed and reduce the power consumption.

As shown in FIGS. 14 to 17, polysilicon as a gate electrode material is deposited on the gate insulating films in the FBC region and peripheral logic circuit region.

Figure 14:
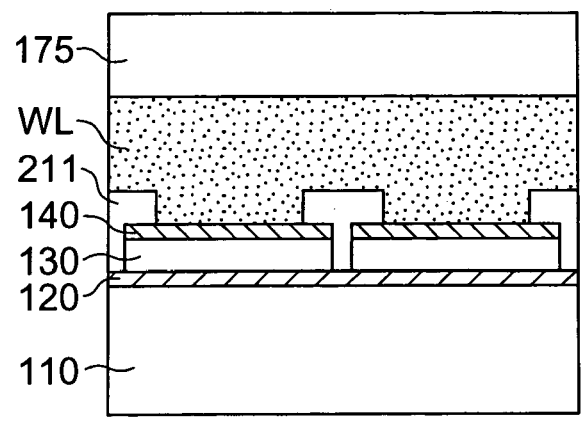
FIG. 14 is a longitudinal sectional view showing a section taken along the line C1-C1 in FIG. 1, as the sectional structure of an element in one step of a method of fabricating the same semiconductor device.

As shown in FIGS. 14 and 16, photolithography is used to form a resist film 175 (not shown) having the pattern of word lines WL in the FBC region.

Figure 15:
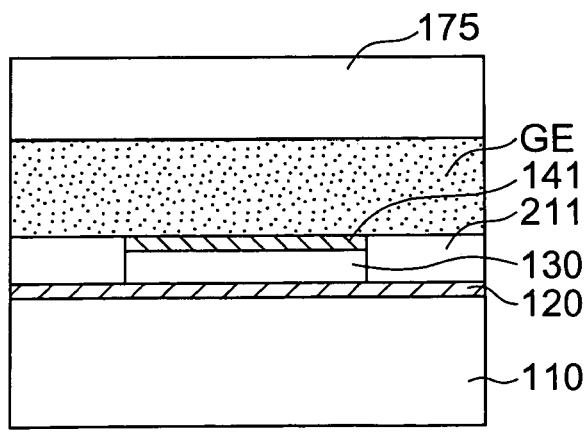
FIG. 15 is a longitudinal sectional view showing a section taken along the line E1-E1 in FIG. 1, as the sectional structure of an element in one step of a method of fabricating the same semiconductor device.

In this state, the peripheral logic circuit region shown in FIGS. 15 and 17 is covered with the resist film 175, so no gate electrode patterning is performed in this region.

The resist film 175 is used as a mask to form word lines WL in the FBC region by RIE.

Since the height H of the STI oxide film 211 is as large as 50 nm, sufficient overetching is necessary. In the FBC region, an overetching amount can be increased because the thickness of the first gate insulating film 140 is as large as 6 nm.

Figure 18:
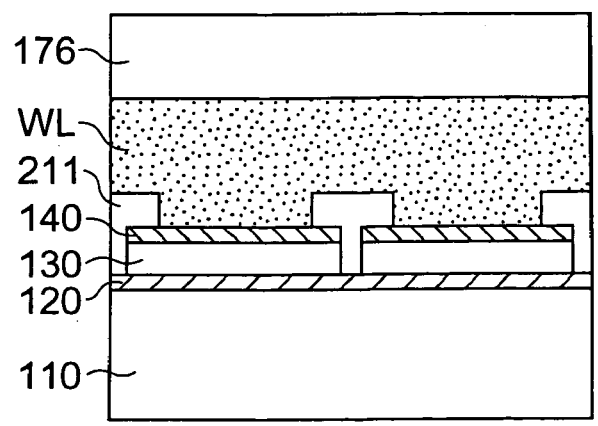
FIG. 18 is a longitudinal sectional view showing a section taken along the line C1-C1 in FIG. 1, as the sectional structure of an element in one step of a method of fabricating the same semiconductor device.

As shown in FIGS. 18 and 20, in the FBC region, the word lines WL are used as masks to ion-implant an impurity in self-alignment in the SOI layer 130. In this manner, a lightly doped drain of about $10^{18}$ cm$^{-3}$ can be formed.

The side surfaces of the word lines WL are covered with spacers 213. The spacers 213 can be formed by using a silicon oxide film or silicon nitride film.

Figure 19:
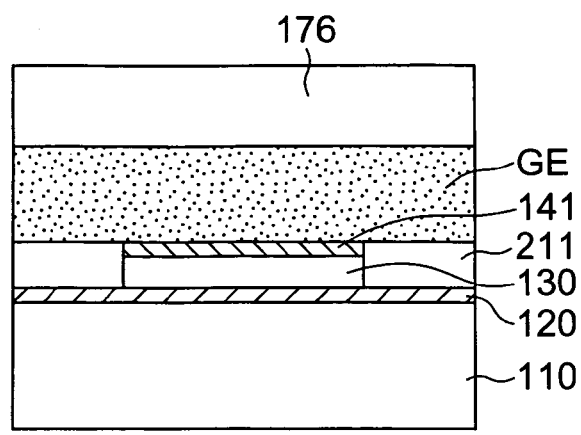
FIG. 19 is a longitudinal sectional view showing a section taken along the line E1-E1 in FIG. 1, as the sectional structure of an element in one step of a method of fabricating the same semiconductor device.

As shown in FIGS. 19 and 21, to form a gate electrode GE in the peripheral logic circuit region, a resist film 176 which covers the FBC region and has the pattern of the gate electrode GE in the peripheral logic circuit is formed. The resist film 176 is used as a mask to perform RIE on polysilicon.

In the peripheral logic circuit region, an overetching amount cannot be increased because the second gate insulating film 141 having a small thickness of 1 nm is formed. Therefore, if in the peripheral logic circuit the height H of the STI oxide film 211 is 50 nm as in the FBC region, a polysilicon residue is produced to decrease the yield of the DRAM.

In this embodiment, however, the height of the STI oxide film 211 in the peripheral logic circuit is smaller than the height H of the STI oxide film in the FBC region. Therefore, no polysilicon residue is produced, and a high-yield DRAM can be implemented.

As shown in FIGS. 22 to 25, the word lines WL and spacers 213 are used as masks to ion-implant an impurity in self-alignment in the SOI layer 130.

In this embodiment, phosphorus or arsenic is ion-implanted in the SOI layer 130. Consequently, as shown in FIG. 24, an n-type source region 132 and n-type drain region 134 are formed.

A p-type body region 136 is formed between the source region 132 and the drain region 134. A metal is deposited on the upper surfaces of the word lines WL, thereby forming silicide layers 160, 162, and 164. The silicide layers 160, 162, and 164 may also be formed by using, e.g., cobalt silicide.

Subsequently, an interlayer dielectric film 170 is deposited on the silicide layers 160, 162, and 164. A plug (not shown) to be electrically connected to the silicide layer 164 is formed in the interlayer dielectric film 170.

In addition, source lines SL to be connected to source plugs (not shown) are formed parallel to the word lines WL, and bit lines BL are formed substantially perpendicularly to the word lines WL. The source lines SL and bit lines BL may also be formed by using a metal material such as copper, aluminum, or tungsten.

The DRAM 100 of this embodiment can be fabricated by the above method.

(3) Semiconductor Device According to Second Embodiment

Figure 26:
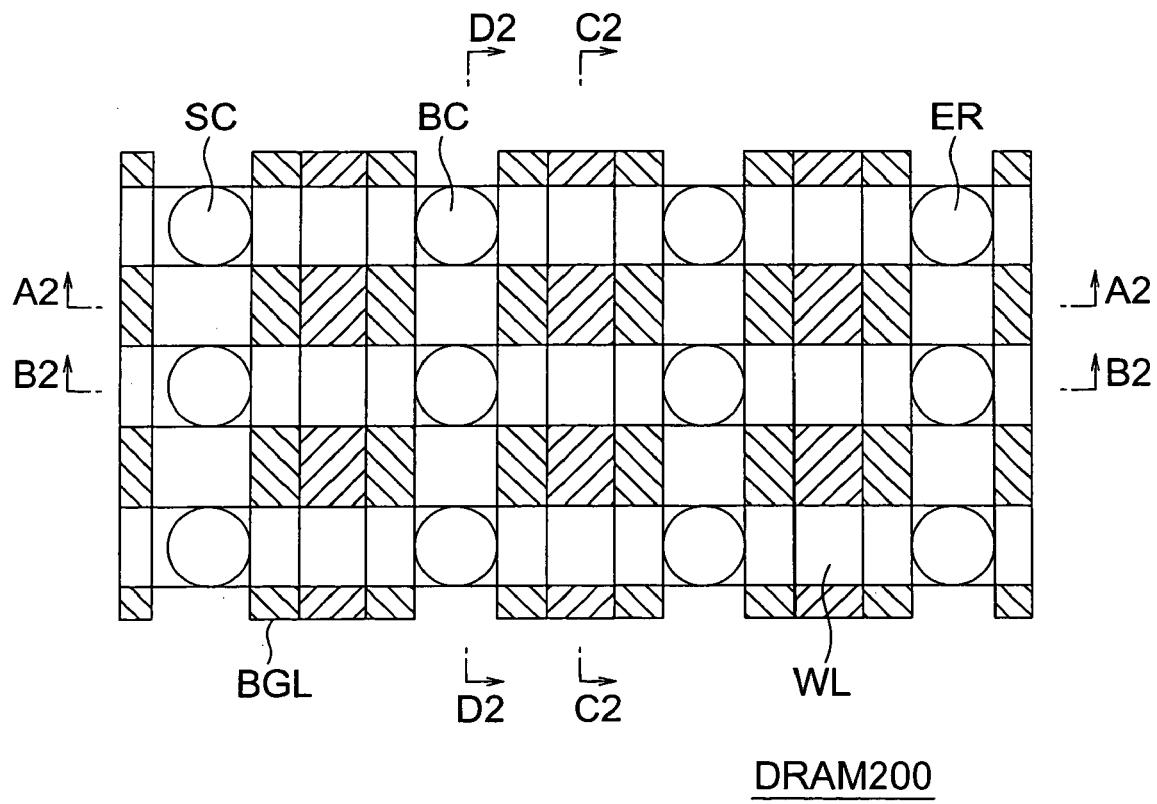
FIG. 26 is a plan view showing the planar arrangement of a semiconductor device according to the second embodiment of the present invention.

FIG. 26 shows the planar arrangement of a semiconductor device (DRAM 200) according to the second embodiment of the present invention.

The DRAM 200 has back gate lines BGL in addition to the constituent elements of the DRAM 100. The back gate lines BGL run substantially parallel to word lines WL.

A front gate electrode FGE (not shown) of a unit transistor is connected to the word line WL, and a back gate electrode BGE (not shown) is connected to the back gate line BGL.

Figure 27:
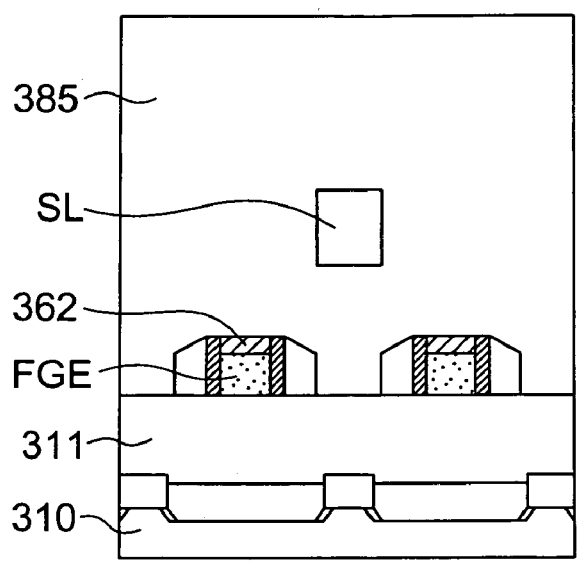
FIG. 27 is a longitudinal sectional view showing a sectional structure taken along a line A2-A2 in FIG. 26.

FIG. 27 shows a longitudinal section taken along a line A2-A2 in FIG. 26.

Figure 28:
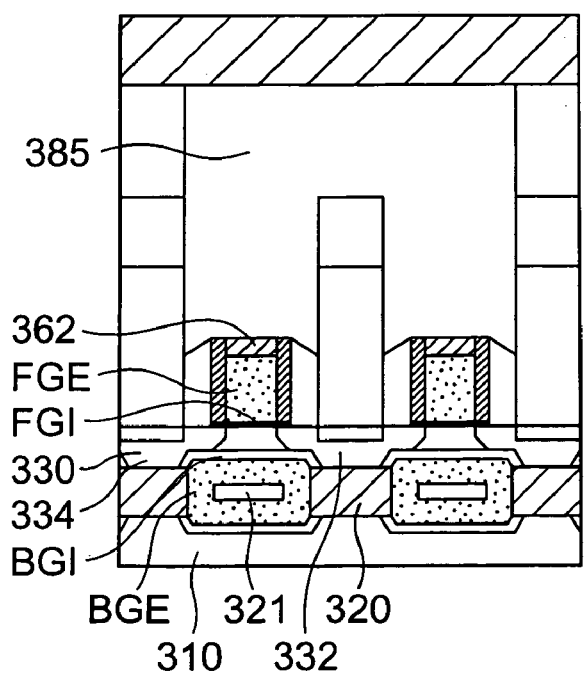
FIG. 28 is a longitudinal sectional view showing a sectional structure taken along a line C2-C2 in FIG. 26.
Figure 29:
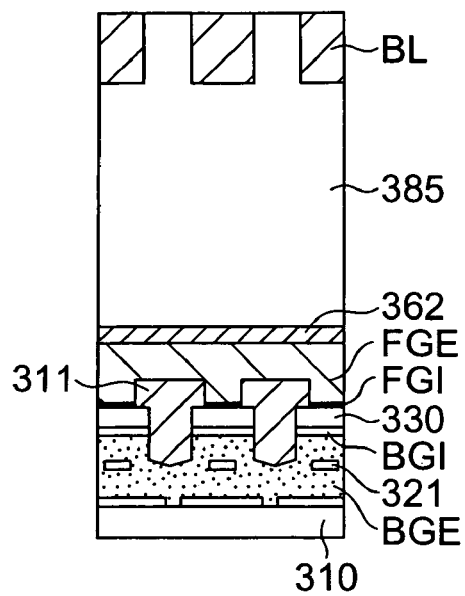
FIG. 29 is a longitudinal sectional view showing a sectional structure taken along a line B2-B2 in FIG. 26.
Figure 30:
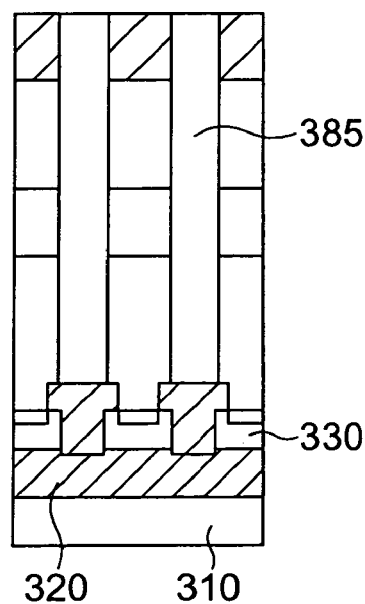
FIG. 30 is a longitudinal sectional view showing a sectional structure taken along a line D2-D2 in FIG. 26.
Figure 31:
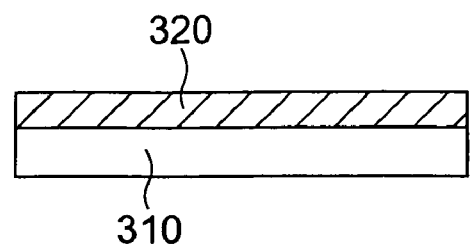
FIG. 31 is a longitudinal sectional view showing a section taken along the line A2-A2 in FIG. 26, as the sectional structure of an element in one step of a method of fabricating the same semiconductor device.
Figure 32:
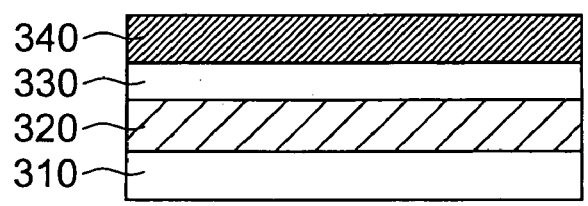
FIG. 32 is a longitudinal sectional view showing a section taken along the line C2-C2 in FIG. 26, as the sectional structure of an element in one step of a method of fabricating the same semiconductor device.
Figure 33:
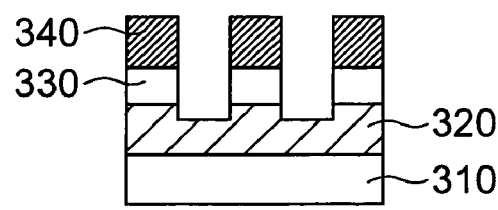
FIG. 33 is a longitudinal sectional view showing a section taken along the line B2-B2 in FIG. 26, as the sectional structure of an element in one step of a method of fabricating the same semiconductor device.
Figure 34:
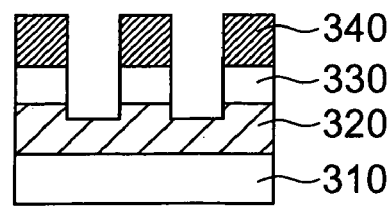
FIG. 34 is a longitudinal sectional view showing a section taken along the line D2-D2 in FIG. 26, as the sectional structure of an element in one step of a method of fabricating the same semiconductor device.
Figure 35:
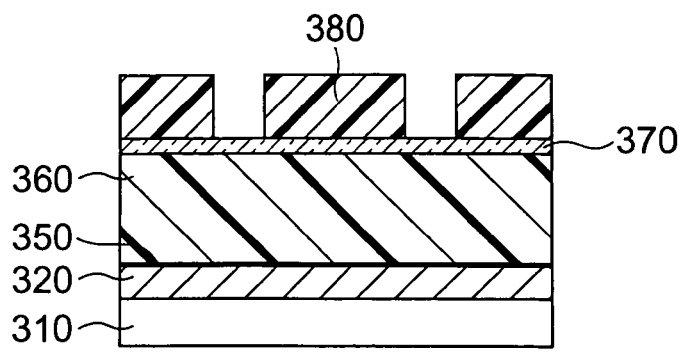
FIG. 35 is a longitudinal sectional view showing a section taken along the line A2-A2 in FIG. 26, as the sectional structure of an element in one step of a method of fabricating the same semiconductor device.
Figure 36:
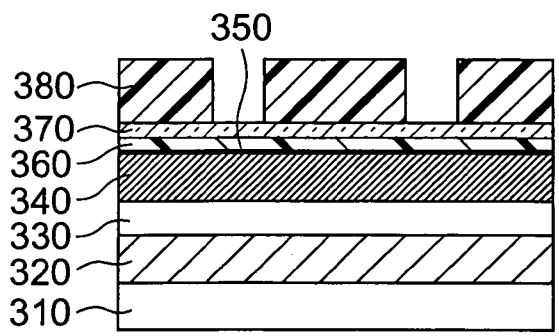
FIG. 36 is a longitudinal sectional view showing a section taken along the line C2-C2 in FIG. 26, as the sectional structure of an element in one step of a method of fabricating the same semiconductor device.
Figure 37:
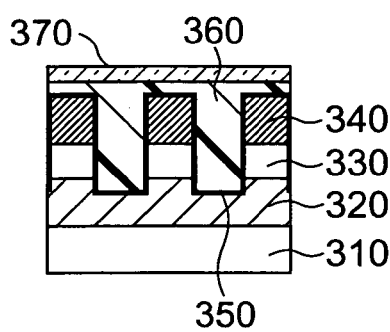
FIG. 37 is a longitudinal sectional view showing a section taken along the line B2-B2 in FIG. 26, as the sectional structure of an element in one step of a method of fabricating the same semiconductor device.
Figure 38:
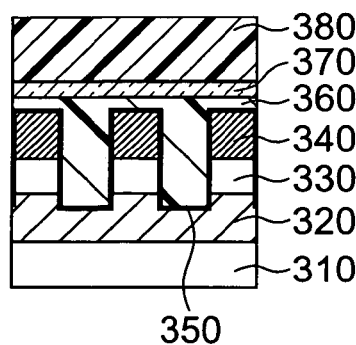
FIG. 38 is a longitudinal sectional view showing a section taken along the line D2-D2 in FIG. 26, as the sectional structure of an element in one step of a method of fabricating the same semiconductor device.
Figure 39:
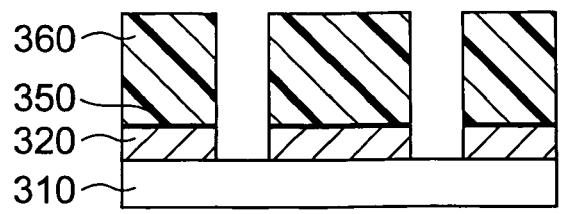
FIG. 39 is a longitudinal sectional view showing a section taken along the line A2-A2 in FIG. 26, as the sectional structure of an element in one step of a method of fabricating the same semiconductor device.
Figure 40:
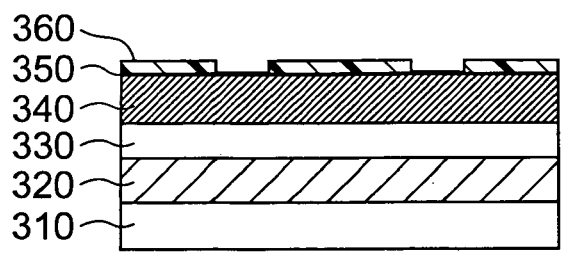
FIG. 40 is a longitudinal sectional view showing a section taken along the line C2-C2 in FIG. 26, as the sectional structure of an element in one step of a method of fabricating the same semiconductor device.
Figure 41:
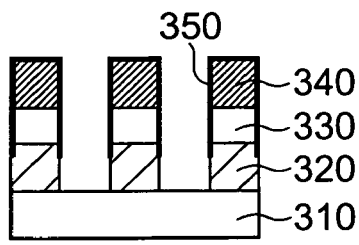
FIG. 41 is a longitudinal sectional view showing a section taken along the line B2-B2 in FIG. 26, as the sectional structure of an element in one step of a method of fabricating the same semiconductor device.
Figure 42:
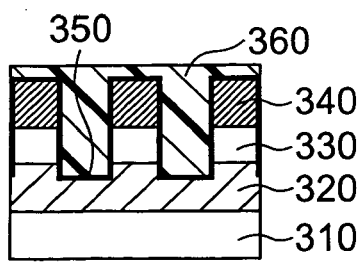
FIG. 42 is a longitudinal sectional view showing a section taken along the line D2-D2 in FIG. 26, as the sectional structure of an element in one step of a method of fabricating the same semiconductor device.
Figure 43:
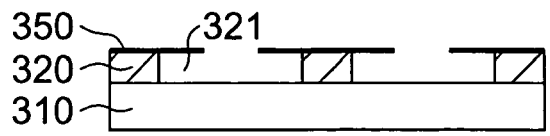
FIG. 43 is a longitudinal sectional view showing a section taken along the line A2-A2 in FIG. 26, as the sectional structure of an element in one step of a method of fabricating the same semiconductor device.
Figure 44:
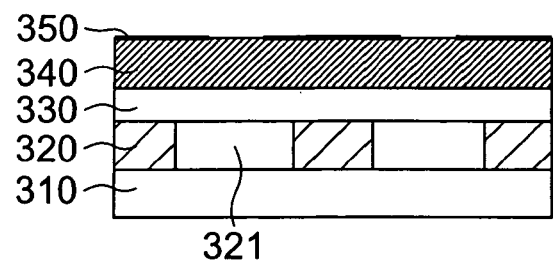
FIG. 44 is a longitudinal sectional view showing a section taken along the line C2-C2 in FIG. 26, as the sectional structure of an element in one step of a method of fabricating the same semiconductor device.
Figure 45:
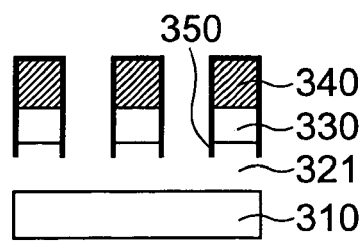
FIG. 45 is a longitudinal sectional view showing a section taken along the line B2-B2 in FIG. 26, as the sectional structure of an element in one step of a method of fabricating the same semiconductor device.
Figure 46:
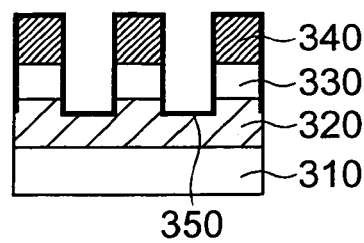
FIG. 46 is a longitudinal sectional view showing a section taken along the line D2-D2 in FIG. 26, as the sectional structure of an element in one step of a method of fabricating the same semiconductor device.
Figure 47:
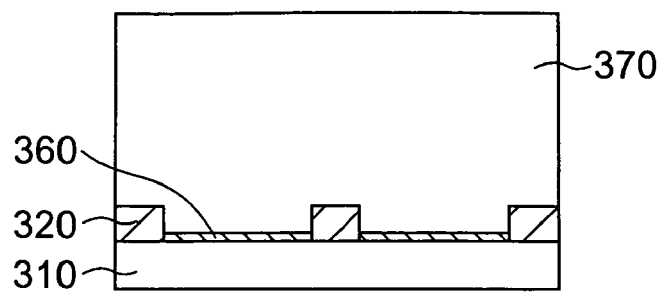
FIG. 47 is a longitudinal sectional view showing a section taken along the line A2-A2 in FIG. 26, as the sectional structure of an element in one step of a method of fabricating the same semiconductor device.
Figure 48:
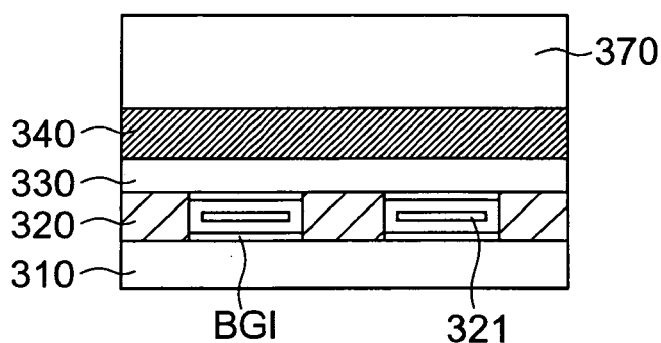
FIG. 48 is a longitudinal sectional view showing a section taken along the line C2-C2 in FIG. 26, as the sectional structure of an element in one step of a method of fabricating the same semiconductor device.
Figure 49:
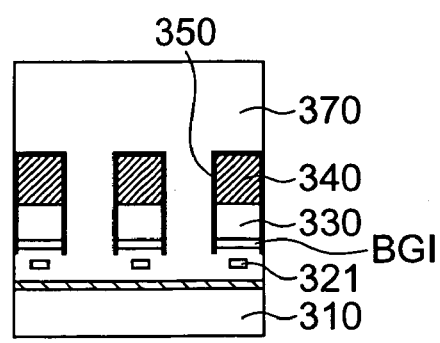
FIG. 49 is a longitudinal sectional view showing a section taken along the line B2-B2 in FIG. 26, as the sectional structure of an element in one step of a method of fabricating the same semiconductor device.
Figure 50:
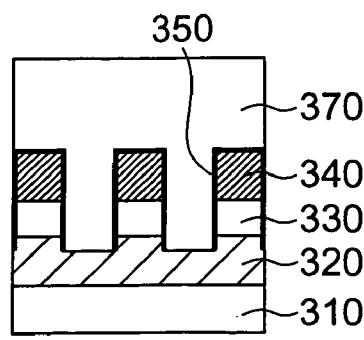
FIG. 50 is a longitudinal sectional view showing a section taken along the line D2-D2 in FIG. 26, as the sectional structure of an element in one step of a method of fabricating the same semiconductor device.
Figure 51:
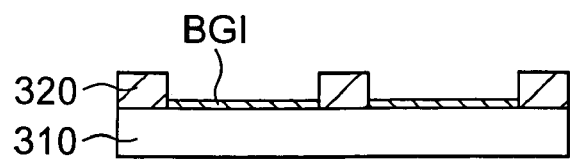
FIG. 51 is a longitudinal sectional view showing a section taken along the line A2-A2 in FIG. 26, as the sectional structure of an element in one step of a method of fabricating the same semiconductor device.
Figure 52:
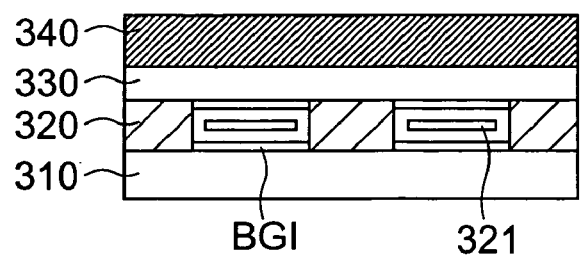
FIG. 52 is a longitudinal sectional view showing a section taken along the line C2-C2 in FIG. 26, as the sectional structure of an element in one step of a method of fabricating the same semiconductor device.
Figure 53:
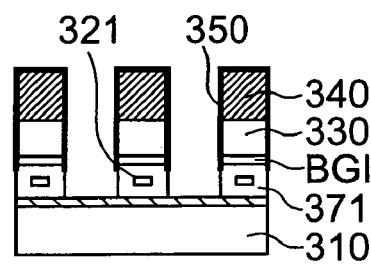
FIG. 53 is a longitudinal sectional view showing a section taken along the line B2-B2 in FIG. 26, as the sectional structure of an element in one step of a method of fabricating the same semiconductor device.
Figure 54:
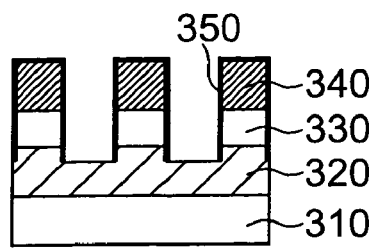
FIG. 54 is a longitudinal sectional view showing a section taken along the line D2-D2 in FIG. 26, as the sectional structure of an element in one step of a method of fabricating the same semiconductor device.
Figure 55:
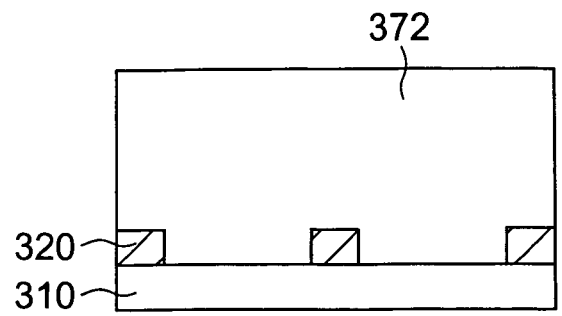
FIG. 55 is a longitudinal sectional view showing a section taken along the line A2-A2 in FIG. 26, as the sectional structure of an element in one step of a method of fabricating the same semiconductor device.
Figure 56:
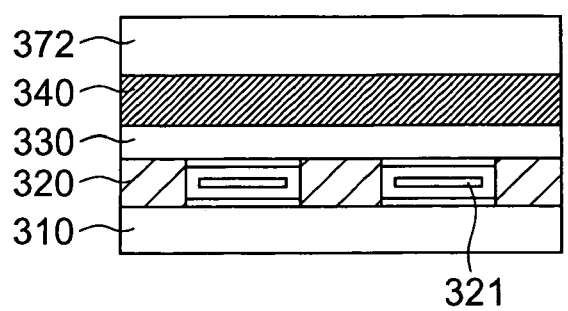
FIG. 56 is a longitudinal sectional view showing a section taken along the line C2-C2 in FIG. 26, as the sectional structure of an element in one step of a method of fabricating the same semiconductor device.
Figure 57:
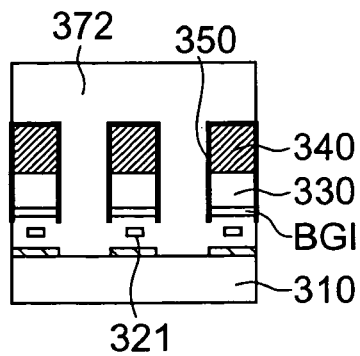
FIG. 57 is a longitudinal sectional view showing a section taken along the line B2-B2 in FIG. 26, as the sectional structure of an element in one step of a method of fabricating the same semiconductor device.
Figure 58:
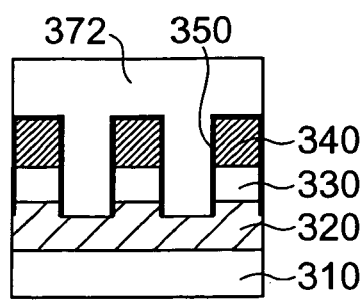
FIG. 58 is a longitudinal sectional view showing a section taken along the line D2-D2 in FIG. 26, as the sectional structure of an element in one step of a method of fabricating the same semiconductor device.
Figure 59:
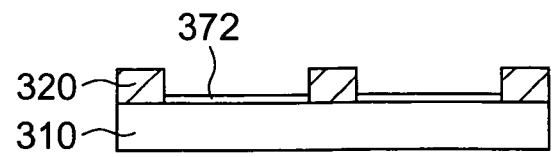
FIG. 59 is a longitudinal sectional view showing a section taken along the line A2-A2 in FIG. 26, as the sectional structure of an element in one step of a method of fabricating the same semiconductor device.
Figure 60:
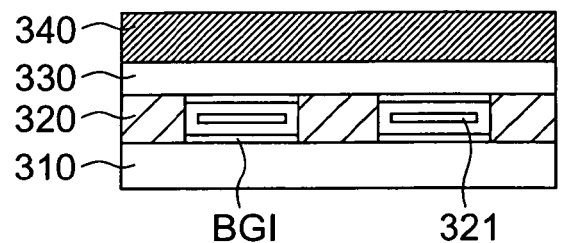
FIG. 60 is a longitudinal sectional view showing a section taken along the line C2-C2 in FIG. 26, as the sectional structure of an element in one step of a method of fabricating the same semiconductor device.
Figure 61:
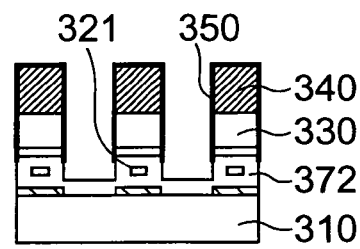
FIG. 61 is a longitudinal sectional view showing a section taken along the line B2-B2 in FIG. 26, as the sectional structure of an element in one step of a method of fabricating the same semiconductor device.
Figure 62:
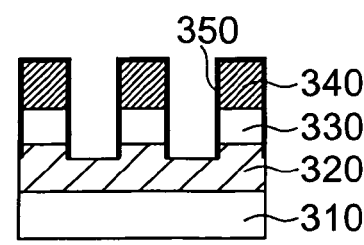
FIG. 62 is a longitudinal sectional view showing a section taken along the line D2-D2 in FIG. 26, as the sectional structure of an element in one step of a method of fabricating the same semiconductor device.
Figure 63:
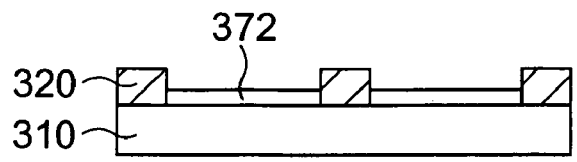
FIG. 63 is a longitudinal sectional view showing a section taken along the line A2-A2 in FIG. 26, as the sectional structure of an element in one step of a method of fabricating the same semiconductor device.
Figure 64:
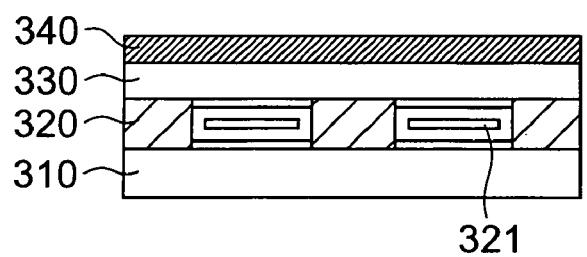
FIG. 64 is a longitudinal sectional view showing a section taken along the line C2-C2 in FIG. 26, as the sectional structure of an element in one step of a method of fabricating the same semiconductor device.
Figure 65:
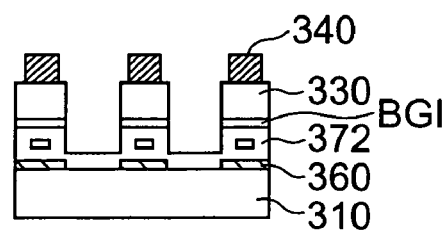
FIG. 65 is a longitudinal sectional view showing a section taken along the line B2-B2 in FIG. 26, as the sectional structure of an element in one step of a method of fabricating the same semiconductor device.
Figure 66:
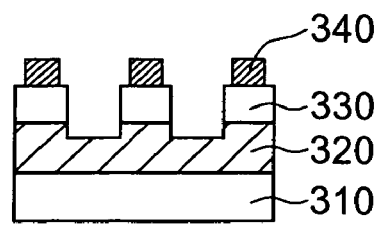
FIG. 66 is a longitudinal sectional view showing a section taken along the line D2-D2 in FIG. 26, as the sectional structure of an element in one step of a method of fabricating the same semiconductor device.
Figure 67:
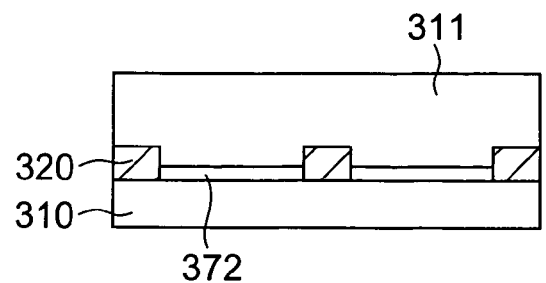
FIG. 67 is a longitudinal sectional view showing a section taken along the line A2-A2 in FIG. 26, as the sectional structure of an element in one step of a method of fabricating the same semiconductor device.
Figure 68:
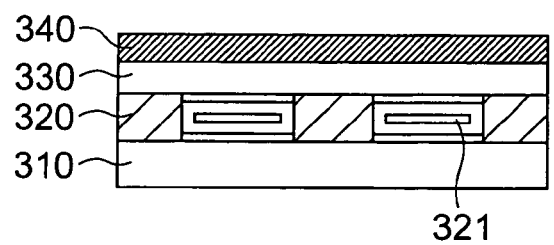
FIG. 68 is a longitudinal sectional view showing a section taken along the line C2-C2 in FIG. 26, as the sectional structure of an element in one step of a method of fabricating the same semiconductor device.
Figure 69:
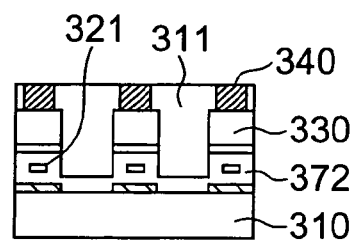
FIG. 69 is a longitudinal sectional view showing a section taken along the line B2-B2 in FIG. 26, as the sectional structure of an element in one step of a method of fabricating the same semiconductor device.
Figure 70:
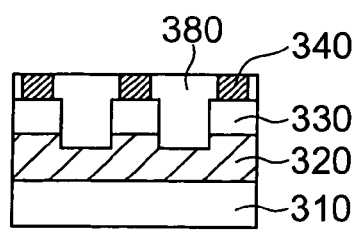
FIG. 70 is a longitudinal sectional view showing a section taken along the line D2-D2 in FIG. 26, as the sectional structure of an element in one step of a method of fabricating the same semiconductor device.

Likewise, FIGS. 28, 29, and 30 illustrate longitudinal sections taken along lines C2-C2, B2-B2, and D2-D2, respectively, in FIG. 26.

As shown in FIGS. 27 to 33, particularly, in FIG. 29, in the semiconductor device according to the second embodiment, the back gate electrode BGE is formed below a body region 336 in the longitudinal section along the word lines WL.

A back gate insulating film BGI (an example of a first insulating film) is formed between the body region and the back gate electrode. Also, a front gate insulating film FGI (an example of a second insulating film) is formed between the body region and the front gate electrode.

In addition, a T-shaped STI oxide film 311 is formed. This makes the contact area between the body region 336 and the front gate insulating film FGI smaller than that between the body region 336 and the back gate insulating film BGI. That is, in the section along the word lines, the channel width is set smaller than the bottom width of the body region. The capacitance between the body region 336 and the front gate electrode FGE corresponds to the capacitance Cg explained in the first embodiment. Also, the capacitance between the body region 336 and the back gate electrode BGE corresponds to the capacitance Csub explained in the first embodiment.

More specifically, as described in detail in the first embodiment, the ratio of the capacitance Csub to the capacitance Cg is higher than the capacitance ratio in the conventional device. This facilitates distinguishing between data "1" and data "0", and implements a DRAM having a high yield and a long data holding time.

(4) Method of Fabricating Semiconductor Device According to Second Embodiment

A method of fabricating the semiconductor device according to the second embodiment described above will be explained below.

FIGS. 31, 35, 39, 43, 47, 51, 55, 59, 63, and 67 illustrate longitudinal sections, in different steps, taken along the line A2-A2 in FIG. 26.

Similarly, FIGS. 32, 36, 40, 44, 48, 52, 56, 60, 64, and 68 illustrate longitudinal sections, in different steps, taken along the line C2-C2 in FIG. 26.

FIGS. 33, 37, 41, 45, 49, 53, 57, 61, 65, and 69 illustrate longitudinal sections, in different steps, taken along the line B2-B2 in FIG. 26.

FIGS. 34, 38, 42, 46, 50, 54, 58, 62, 66, and 70 illustrate longitudinal sections, in different steps, taken along the line D2-D2 in FIG. 26.

First, as shown in FIGS. 31 to 34, an SOI substrate having a BOX layer 320 and SOI layer 330 on the upper surface of a support substrate 310 is prepared. The thickness of the BOX layer 320 is, e.g., 150 nm.

On the SOI layer 330, a silicon nitride film 340 and a silicon oxide film (not shown) are deposited in order.

A resist film (not shown) is used as a mask to perform reactive ion etching, thereby selectively removing the silicon oxide film, silicon nitride film 340, and SOI layer 330, and selectively removing the BOX layer 320 to the middle of its depth. After that, the resist film is peeled, and the silicon oxide film is removed.

On the side surfaces of the SOI layer 330, a thermal oxide film (not shown) about 2 nm thick is formed.

As shown in FIGS. 35 to 38, a silicon nitride film 350 as an etching stopper about 10 nm thick is formed by CVD so as to cover the surfaces of the silicon nitride film 340, SOI layer 330, and BOX layer 320.

A resist film 360 for reducing steps is formed on the silicon nitride film 350, and an SOG (Spin On Glass) film 370 is formed on the resist film 360.

Then, a resist film 380 is formed on the SOG film 370. The resist film 380 has openings in positions where portions corresponding to word line formation regions intersect portions corresponding to regions in which an STI oxide film for isolating element regions of a plurality of transistors is to be formed.

As shown in FIGS. 39 to 42, the resist film 380 is used as a mask to perform reactive ion etching, thereby selectively removing the SOG film 370, resist film, silicon nitride film 350, and BOX layer 320.

As shown in FIGS. 43 to 46, the resist film 380, SOG film 370, and resist film 360 are removed.

Etching stoppers are formed by the silicon nitride films 340 and 350. These etching stoppers thus formed are used to remove the BOX layer 320 by wet etching using ammonium fluoride. In this manner, hollow portions 321 are formed below the SOI layer 330 where channel bodies are to be formed.

As shown in FIGS. 47 to 50, the silicon nitride film 340 is anisotropically etched. In addition, thermal oxidation is performed to form a silicon oxide film 360 on the exposed surfaces of the silicon substrate 310 and SOI layer 330.

The silicon oxide film in contact with the SOI layer 330 exposed to the hollow portions 321 is the back gate insulating film BGI. The thickness of the back gate insulating film BGI is about 10 nm.

Then, CVD is used to deposit an arsenic-doped amorphous silicon film 370.

As shown in FIGS. 51 to 54, the amorphous silicon film 370 is etched to form an amorphous silicon film 371.

As shown in FIGS. 55 to 58, the exposed silicon oxide film is removed by using ammonium fluoride, and an amorphous silicon film 372 as an example of an arsenic-doped conductive film is deposited by CVD.

As shown in FIGS. 59 to 62, the amorphous silicon film 372 is etched back by anisotropic etching with the etching stoppers made of the silicon nitride films 340 and 350 left behind between adjacent element isolating portion formation regions, i.e., between adjacent element formation regions.

In this manner, back gate lines are patterned while the film thickness of the amorphous silicon film 372 is decreased in the element isolating portion formation regions.

That is, in order to form back gate electrodes via the back gate insulating film BGI, back gate lines for connecting the back gate electrodes together are patterned along the direction of word line formation regions.

After the back gate lines are thus patterned, as shown in FIGS. 63 to 66, hot phosphoric acid is used to etch the silicon nitride film 340 until it recedes by about 60 nm.

This etching amount determines the cover amount of the silicon oxide film which covers the corners of the upper surface of a body region, i.e., determines the shoulder width S. Therefore, the etching amount must be appropriately set in accordance with the characteristics of the FBC.

As shown in FIGS. 67 to 70, a silicon oxide film 311 as an element isolating portion is formed on the entire surface of the SOI substrate by CVD.

Then, the silicon oxide film 311 is planarized by CMP (Chemical Mechanical Polishing) by using the silicon nitride film 340 as a stopper.

The subsequent steps are the same as in the first embodiment, so a detailed explanation thereof will be omitted.

(5) Semiconductor Device According to Third Embodiment

A DRAM 300 according to the third embodiment of the present invention will be described below with reference to the accompanying drawings.

Figure 71:
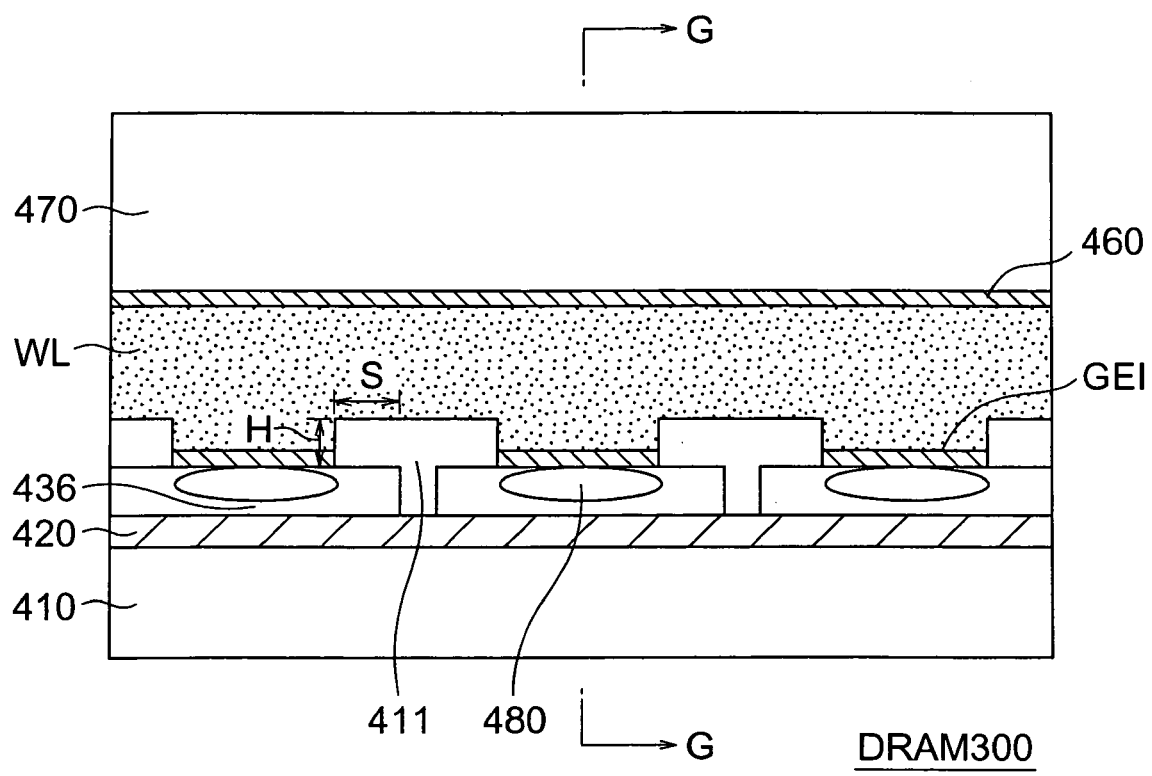
FIG. 71 is a longitudinal sectional view showing the sectional structure, along a word line, of a semiconductor device according to the third embodiment of the present invention.

FIG. 71 shows the longitudinal sectional structure, cut along the longitudinal direction of word lines WL, of an FBC included in the DRAM 300.

In the DRAM 300, as in the first embodiment, the corners on the two sides of the upper surface of a body region are covered with shoulders having a width S and height H on the two sides of a T-shaped STI oxide film 411.

This increases the difference between drain currents when data "0" and "1" are read out, and extends the data holding time.

Also, that central upper surface portion of a body region 436, which is not covered with the shoulders of the STI oxide film 411 contains an impurity (counter impurity) 480 having a conductivity type opposite to that of the bottom portion. This lowers the threshold voltage of a transistor, and implements a low-power-consumption DRAM.

The principle of reducing the power consumption will be explained below. To increase the difference between drain currents when data "0" and data "1" are read out, it is possible to increase the difference between body potentials during holding, or increase the body effect. The body effect is a phenomenon in which the body potential modulates the drain current.

When the impurity concentration in the body region is increased, the thickness of a depletion layer below the gate decreases, and this strengthens the capacitance coupling between the body region and a channel region, and increases the body effect. The difference between drain currents can be increased by increasing the body effect.

If, however, the acceptor impurity concentration in the body region rises, the threshold voltage of the transistor rises. Accordingly, it is necessary to rise the gate voltage during data read and write. This poses the problem that the power consumption of the DRAM increases.

To solve this problem, in this embodiment, the acceptor concentration in the bottom region of the body region 436 is $1 \times 10^{18}$ cm$^{-3}$ or more.

In the central upper surface portion 480 of the body region 436, an impurity (counter impurity) having a conductivity type opposite to that in the bottom region is doped to set the net acceptor impurity concentration at $1 \times 10^{17}$ cm$^{-3}$.

The central upper surface portion 480 is a region from the surface to a depth of about 20 nm.

When a gate voltage equal to or higher than the threshold voltage is applied to a transistor having an acceptor concentration of $1 \times 10^{17}$ cm$^{-3}$, a depletion layer width formed below the channel region, i.e., a so-called maximum depletion layer width is about 100 nm. Therefore, the central upper surface portion 480 having a depth of 20 nm is depleted. The threshold voltage of a transistor is determined by the acceptor concentration in the surface portion. In this embodiment, therefore, the threshold voltage of a transistor can be lowered.

Also, the addition of the central surface portion 480 corresponding to a lightly doped surface layer 20 nm thick increases the maximum depletion layer width below the first gate insulating film.

Since, however, the bottom region of the body region 436 has a concentration of $1 \times 10^{18}$ cm$^{-3}$ or more, the increase is about 1/10 the thickness of the lightly doped surface layer. This slightly lowers the body effect.

Figure 72:
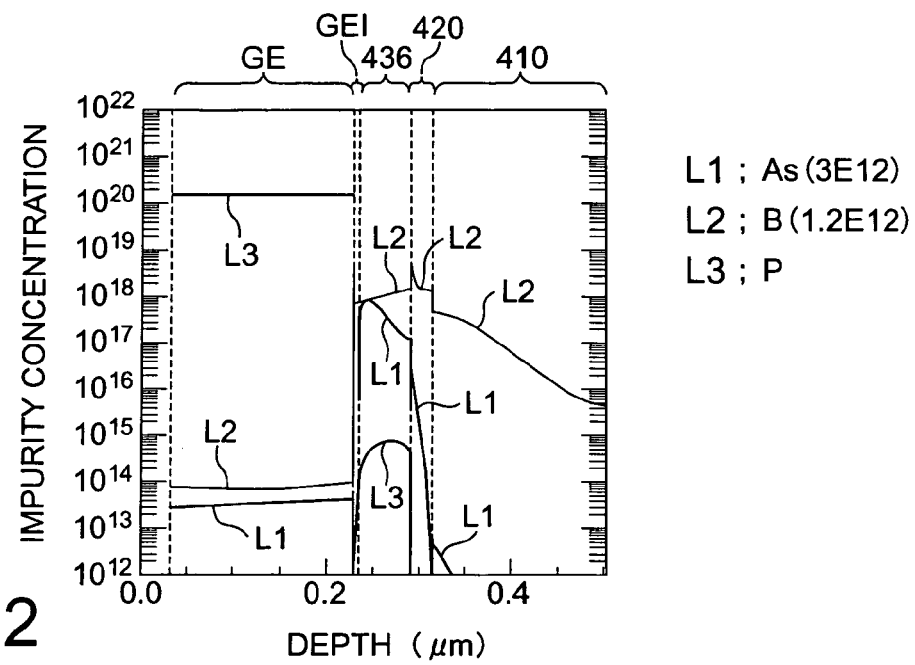
FIG. 72 is a graph showing the impurity concentration profile in the same semiconductor device.

FIG. 72 shows the distribution of each impurity concentration in the direction of depth. That is, curves L1, L2, and L3 indicates the impurity concentrations of arsenic, boron, and phosphorus, respectively, in a gate electrode GE, a gate insulating film GEI, the body region 436, a BOX layer 420, and a support substrate 410.

As shown in FIG. 72, the counter impurity region 480 is formed in self-alignment in the center of the body region 436, i.e., in a first gate insulating film formation region which is not covered with the shoulders of the STI buried oxide film 411.

To realize this structure, it is desirable to dope boron and arsenic as a counter impurity in the bottom region of the body region 436.

Since boron is a relatively light element, the distribution curve after ion implantation is moderate. By contrast, arsenic is a heavy element, so the distribution after ion implantation forms a steep curve.

Also, the diffusion coefficient of arsenic is smaller than that of boron. After a heating step, therefore, boron evenly distributes in the body region by diffusion, but arsenic hardly diffuses and does not change the distribution shape.

Figure 73:
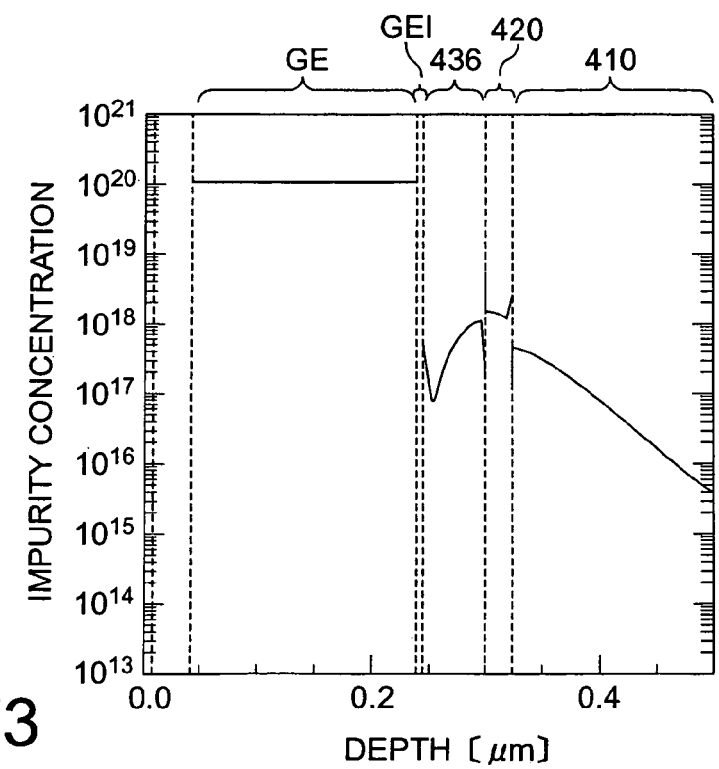
FIG. 73 is a graph showing the acceptor impurity concentration profile in a body region of the same semiconductor device.

FIG. 73 shows the result of simulation of the net acceptor concentration distribution of the sum of arsenic, boron, and phosphorus in the direction of depth in particularly the central portion of the body region 436.

Assume that the acceleration voltage and dose of boron as an impurity are 15 keV and $1\times10^{13}$ cm$^{-2}$, respectively, the thickness of the body region 436 is 55 nm, the thickness of the BOX layer 420 is 25 nm, the thickness of the gate oxide film is 6 nm, the gate length is 0.15 µm, and the drain voltage is 1.5 V.

The acceptor concentration is $1.2\times10^{18}$ cm$^{-3}$ in the bottom region and $1\times10^{17}$ cm$^{-3}$ or less in the central surface region of the body region 436.

Figure 74:
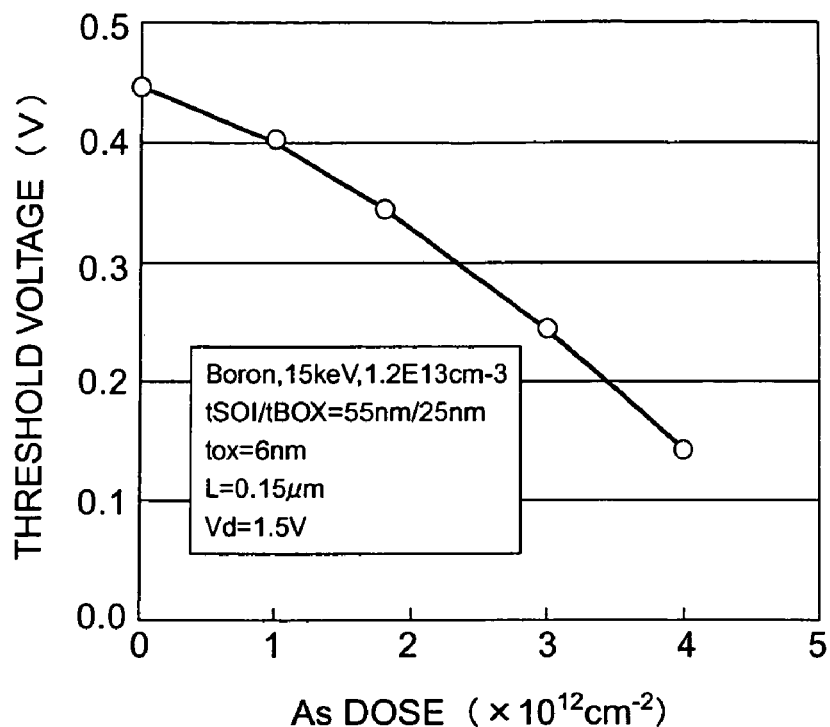
FIG. 74 is a graph showing the relationship between the dose of arsenic as a counter impurity and the threshold voltage.

FIG. 74 shows the result of simulation performed on the relationship between the dose of arsenic doped as a counter impurity and the threshold voltage. As shown in FIG. 74, as the dose of arsenic increases, the threshold voltage of the transistor lowers.

In this embodiment, an impurity having a conductivity type opposite to that of an impurity doped in the bottom portion is doped as a counter impurity in the central surface portion of the body region 436. This makes it possible to lower the threshold voltage of the transistor and reduce the power consumption.

(6) Method of Fabricating Semiconductor Device According to Third Embodiment

A method of fabricating the semiconductor device according to the third embodiment of the present invention will be explained below.

Figure 75:
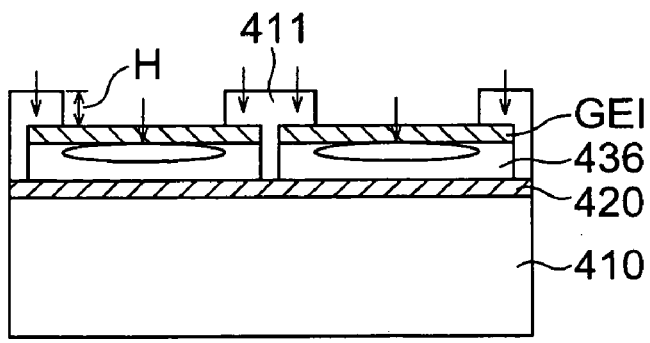
FIG. 75 is a longitudinal sectional view showing the sectional structure of an element in one step of a method of fabricating the same semiconductor device.

As shown in FIG. 75, an SOI substrate having, on a support substrate 401, a 25-nm thick BOX layer 420 and a 60-nm thick SOI layer, in which a body region 436 is to be formed, is prepared. A structure having a gate insulating film GEI and an STI insulating film 411 is obtained through the same fabrication steps as in the first embodiment described earlier.

As indicated by the arrows, arsenic is ion-implanted at an acceleration energy of 20 keV and a dose of $3\times10^{12}$ cm$^{-2}$.

In this state, the corners of the upper surface of the body region 436 are covered with the 60-nm high STI oxide film 411. Therefore, arsenic can be doped in self-alignment in a region where the first gate insulating film GEI is formed. After that, the semiconductor device can be fabricated through the same steps as in the fabrication method according to the first embodiment.

(7) Semiconductor Device According to Fourth Embodiment

Figure 76:
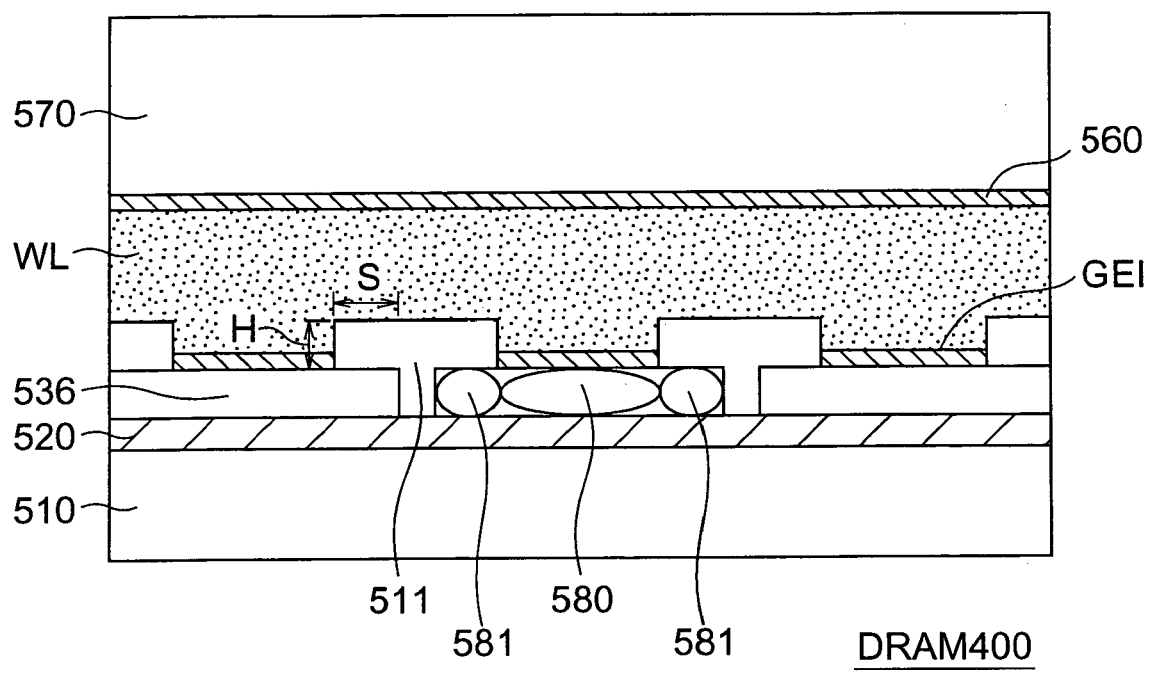
FIG. 76 is a longitudinal sectional view showing the sectional structure of an element in a semiconductor device according to the fourth embodiment of the present invention.

FIG. 76 is a longitudinal sectional view, cut along word lines WL, of an FBC in a DRAM 400 according to the fourth embodiment of the present invention.

In the DRAM 400, as in the first embodiment, the corners of the upper surface of a body region 536 are covered with shoulders having a height H and a width S of an STI oxide film 511.

The body region 536 contains an impurity at a concentration of about $1\times10^{18}$ cm$^{-3}$ as an acceptor impurity concentration by which the whole body region 536 is not depleted even when a voltage equal to or higher than the threshold voltage is applied to the gate.

Also, a central region 580 of the body region 536, which is not covered with the shoulders of the STI oxide film 511 has an impurity concentration of, e.g., $1\times10^{17}$ cm$^{-3}$ as an impurity concentration by which the entire body region 536 is depleted when a voltage equal to or higher than the threshold voltage of the transistor is applied to the gate.

The film thickness of the body region 536 is 55 nm. The central region 580 contains boron at an impurity concentration of, e.g., $1\times10^{17}$ cm$^{-3}$. When a gate voltage equal to or higher than the threshold voltage is applied to a transistor having an acceptor concentration of $1\times10^{17}$ cm$^{-3}$, a depletion layer formed below the channel is about 100 nm. Therefore, the 55-nm thick body region 536 is entirely depleted.

Also, end regions 581 of the channel contain boron at an impurity concentration of, e.g., $2\times10^{18}$ cm$^{-3}$.

Since a depletion layer at this impurity concentration is about 25 nm, the 55-nm thick end regions 581 are not entirely depleted, but have neutral regions.

The following effects are obtained by the DRAM 400 of this embodiment.

First, the threshold voltage of the transistor can be lowered.

This is so because the central region 580 of the body region 536, which is not covered with the shoulders of the STI oxide film 511 has a low acceptor impurity concentration.

Consequently, it is possible to lower the gate voltage during data read and write, and reduce the power consumption of the DRAM.

Second, the reverse bias p-n junction current can be reduced.

In the conventional fully-depleted FBC, the body bottom portion must be set in a surface accumulation state by well pulling the potential of this body bottom portion toward the negative side by applying a negative voltage to the support substrate.

Since this increases the electric field of the p-n junction formed by the body and the source/drain, a large p-n junction current flows, and the data holding time shortens.

By contrast, in the DRAM 400 according to this embodiment, while the body central region 580 having a low impurity concentration is fully-depleted, the body peripheral regions 581 having a high impurity concentration have neutral regions.

In the FBC having this structure, data "0" and data "1" can be distinguished from each other by the number of holes in the neutral regions of the body peripheral regions 581, without applying any large negative potential to the support substrate 510.

As a consequence, the DRAM 400 can raise the voltage of the support substrate 510, weaken the p-n junction electric field, and reduce the p-n junction current, when compared to the conventional fully-depleted FBC.

The third effect is that the difference between drain currents when data "0" and data "1" are read out can be increased.

The neutral regions which are not fully-depleted are formed in the body peripheral regions 581 covered with the thick STI oxide film 511. As described in the first embodiment, therefore, the capacitance coupling Cg between the gate electrode and the neutral regions can be decreased.

Consequently, the difference between drain currents when data "0" and data "1" are read out can be made larger than that in a structure in which no T-shaped STI oxide film having shoulders with a height H is formed.

Also, since the neutral regions are formed in self-alignment in the body peripheral regions 581, variations in characteristics can be suppressed.

The fourth effect is the same as the third effect, i.e., the difference between drain currents when data "0" and data "1" are read out can be increased.

The body central region 580 not covered with the shoulders of the STI oxide film 511 is fully-depleted. In the fully-depleted device, the strength of the body effect is inversely proportional to the SOI film thickness. Accordingly, the difference between drain currents when data "0" and data "1" are read out can be increased by decreasing the SOI film thickness, i.e., the film thickness of the body region 536.

The results of simulation of write and read operations performed in the DRAM 400 according to the fourth embodiment will be explained below.

Figure 77:
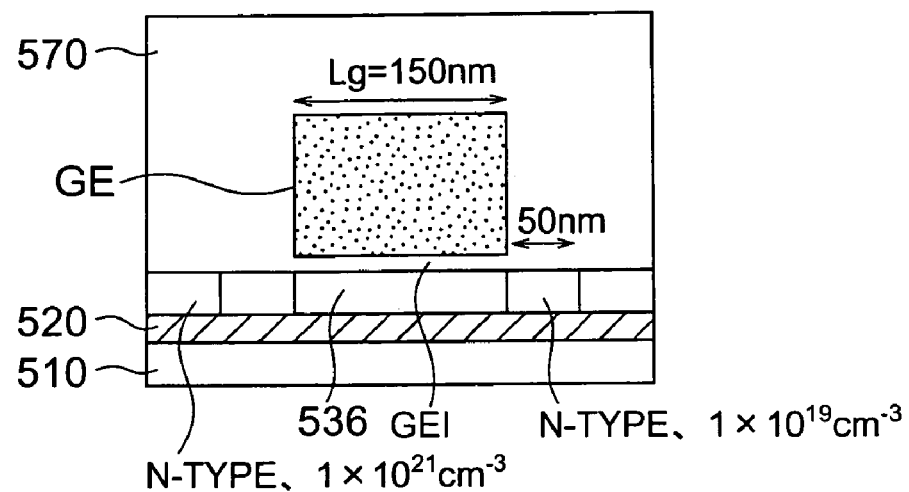
FIG. 77 is a longitudinal sectional view showing the sectional structure, along a bit line, of the same semiconductor device.
Figure 78:
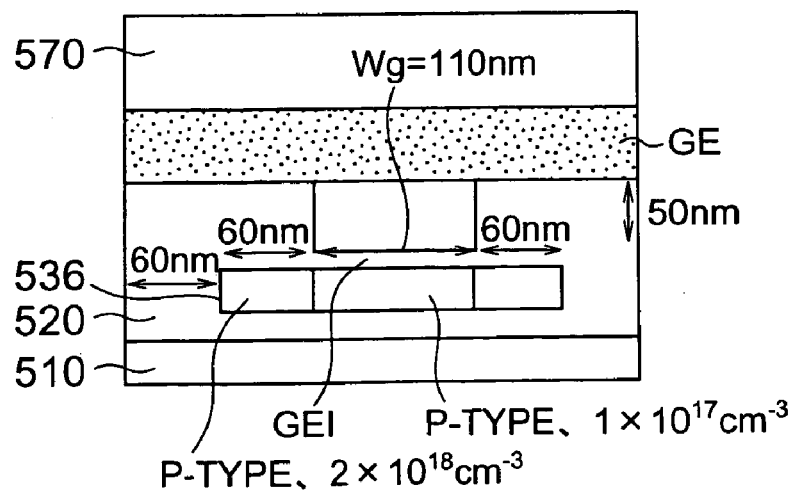
FIG. 78 is a longitudinal sectional view showing the sectional structure, along a word line, of the same semiconductor device.

FIGS. 77 and 78 illustrate the longitudinal sectional structures, along bit lines and word lines, respectively, of the FBC in the DRAM 400. FIG. 78 shows a longitudinal sectional structure along word lines. The film thickness of the SOI layer, i.e., the body region 536 is 35 nm, the film thickness of the gate insulating film GEI is 6 nm, and the film thickness of the BOX oxide film 520 is 20 nm.

Also, as shown in FIG. 78, a channel width Wg is 110 nm, and a region below the channel contains an impurity at a concentration of $1\times10^{17}$ cm$^{-3}$. The width S of the shoulder of the STI oxide film 511 is 60 nm, and an impurity is contained in the shoulder region at a concentration of $2\times10^{18}$ cm$^{-3}$.

The results of comparison between the DRAM 400 according to the fourth embodiment and a conventional DRAM, in which the channel width Wg and the width Wb of the body region are equally 230 nm, and which contains an impurity at an impurity concentration of $1\times10^{17}$ cm$^{-3}$, will be explained below.

Figure 79:
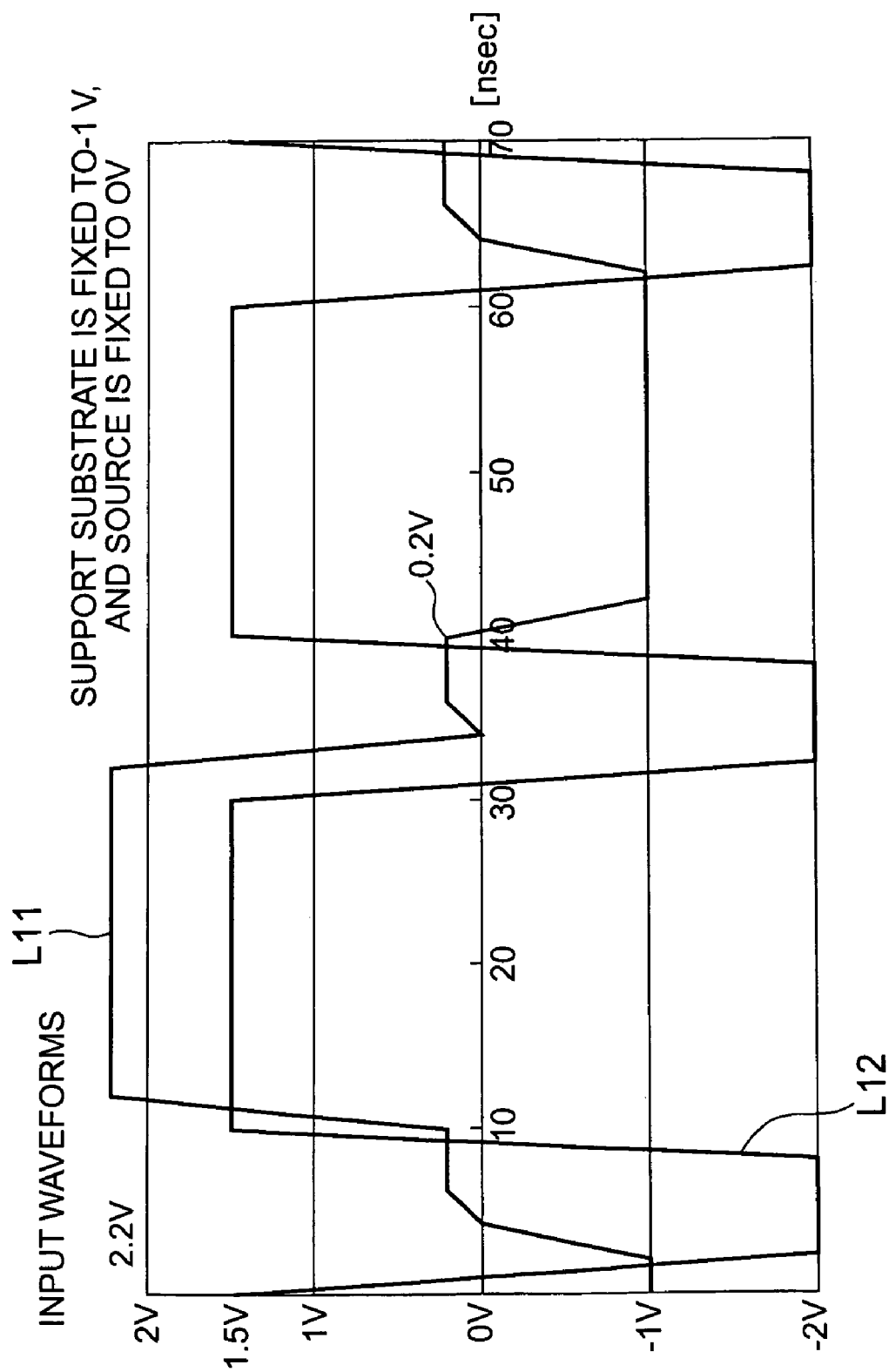
FIG. 79 is a graph showing input waveforms to the same semiconductor device and to a semiconductor device according to a comparative example.

FIG. 79 shows input waveforms. A curve L11 indicates the drain voltage, and a curve L12 indicates the gate voltage. The support substrate is fixed to −1 V, while the source region is fixed to 0 V.

Data "1" is written from time 12 nsec to time 30 nsec. Data "0" is written from time 42 nsec to time 60 nsec.

Data is read out from time 38 nsec to time 40 nsec, and from time 68 nsec to time 70 nsec.

Figure 80:
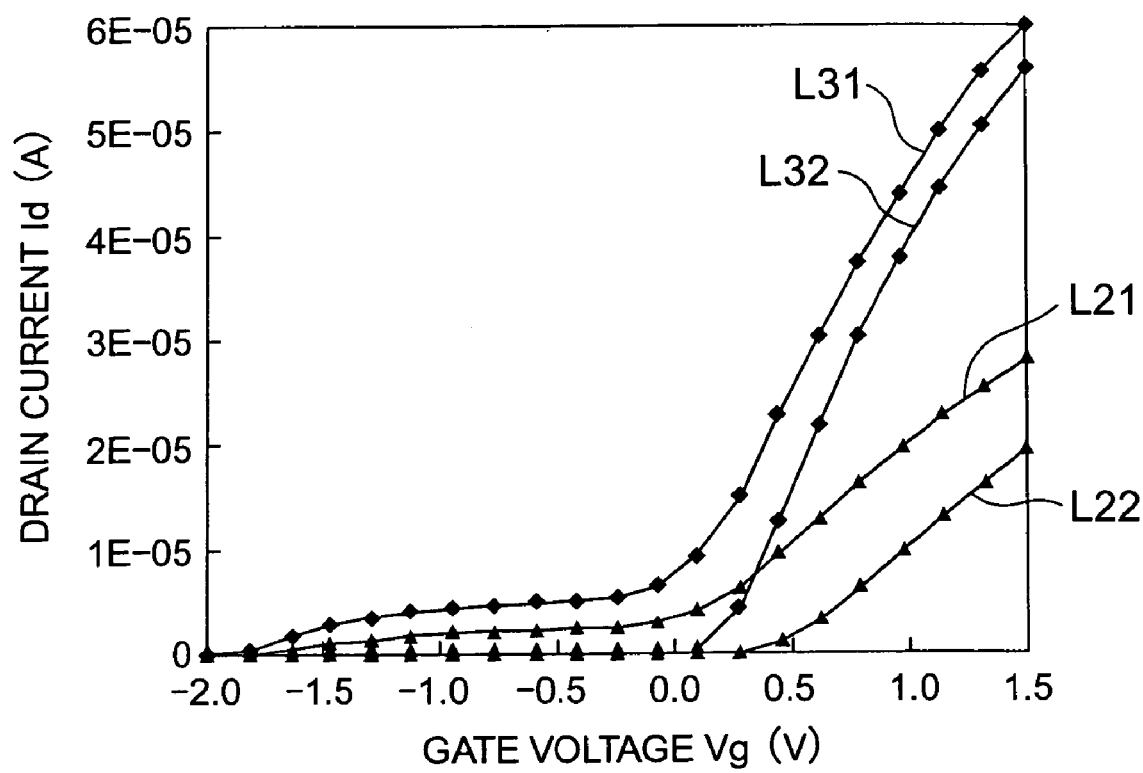
FIG. 80 is a graph showing the difference between drain currents when data "1" and "0" are read out from the same semiconductor device and the semiconductor device according to the comparative example.

FIG. 80 shows the results of simulation of a drain current Id as a function of a gate voltage Vg when data is read out from time 38 nsec to time 40 nsec, and from time 68 nsec to time 70 nsec. The difference between a curve L21 when data "1" is read out and a curve L22 when data "0" is read out from the DRAM of this embodiment, i.e., the difference between drain currents Id of data "0" and data "1" is larger than the difference between a curve L31 when data "1" is read out and a curve L32 when data "0" is read out from the DRAM as a comparative example.

(8) Method of Fabricating Semiconductor Device According to Fourth Embodiment

A method of fabricating the semiconductor device according to the fourth embodiment of the present invention will be explained below.

Figure 81:
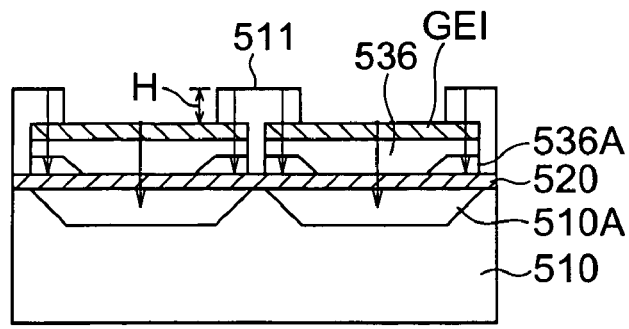
FIG. 81 is a longitudinal sectional view showing the sectional structure of an element in one step of a method of fabricating the semiconductor device according to the fourth embodiment of the present invention.

An SOI substrate having a 25-nm thick BOX layer 520 and 60-nm thick SOI layer on a support substrate 510 is prepared, and a structure shown in FIG. 81 is obtained through the same fabrication steps as in the first embodiment.

Then, a resist film (not shown) which has an opening in an FBC formation region and covers a peripheral circuit formation region is formed.

This resist film is used as a mask to ion-implant boron at an acceleration energy of 130 keV and a dose of $1\times10^{14}$ cm$^{-2}$. After that, the resist film is removed. Annealing is then performed for about 10 min in a nitrogen ambient at 1,200° C.

Consequently, boron evenly distributes at an impurity concentration of $1\times10^{18}$ cm$^{-3}$ in the FBC formation region of the support substrate 510.

The boron diffusion layer formed in the support substrate 510 extends outside the FBC cell array. This boron diffusion layer is connected to an interconnection by a contact plug (not shown) formed on the diffusion layer, and given a fixed voltage.

A resist film having an opening in the FBC formation region is used as a mask to ion-implant boron at an acceleration energy of 30 keV and a dose of $2\times10^{13}$ cm$^{-2}$.

In this state, the corners of the upper surface of the body region are covered with shoulders, having a height H of 60 nm, of an STI oxide film 511.

As indicated by regions 510A in FIG. 81, therefore, boron is mostly implanted into the support substrate 510 in regions where a gate insulating film is to be formed. In regions covered with the STI oxide film 511, boron is mostly implanted into the SOI layer as indicated by regions 536A.

Accordingly, the boron concentration in the SOI layer in the regions covered with the STI oxide film 511 can be made higher, by self-alignment, than that in the SOI layer in the regions where a gate insulating film is to be formed.

After that, the semiconductor device of this embodiment can be completed through the same steps as in the fabrication method according to the first embodiment.

Another method of fabricating the semiconductor device according to the fourth embodiment will be described below.

Figure 82:
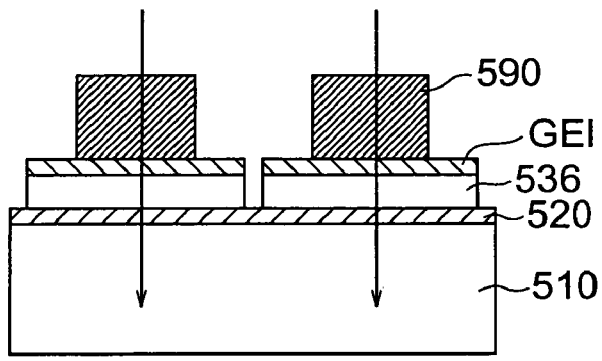
FIG. 82 is a longitudinal sectional view showing the sectional structure of an element in one step of another method of fabricating the semiconductor device according to the fourth embodiment of the present invention.

An SOI substrate having a 25-nm thick BOX layer 520 and 60-nm thick SOI layer on a support substrate 510 is prepared. A structure in which an SOI layer 536 is patterned as shown in FIG. 82 is obtained through the same fabrication steps as in the first embodiment.

Then, a resist film (not shown) having an opening in an FBC formation region is formed.

This resist film is used as a mask to ion-implant boron at an acceleration energy of 260 keV and a dose of $1.5\times10^{14}$ cm$^{-2}$. After that, a resist film 590 is removed.

Annealing is then performed for about 10 min in a nitrogen ambient at 1,200° C.

Consequently, boron evenly distributes at an impurity concentration of $1\times10^{18}$ cm$^{-3}$ in the FBC formation region of the support substrate 510.

The boron diffusion layer formed in the support substrate 510 extends outside the FBC cell array. This boron diffusion layer is connected to an interconnection by a contact plug (not shown) formed on the diffusion layer, and given a fixed voltage.

Figure 83:
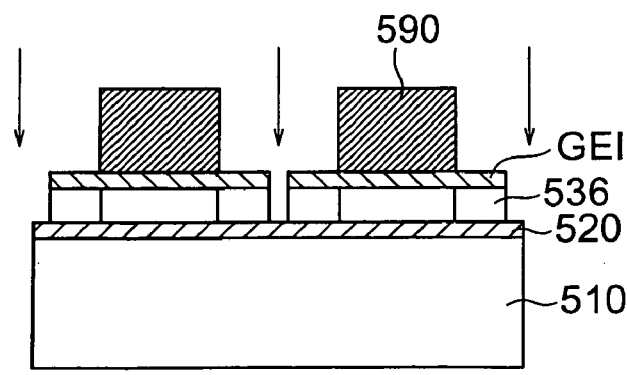
FIG. 83 is a longitudinal sectional view showing the sectional structure of an element in one step of a method of fabricating the same semiconductor device.

As shown in FIG. 83, a resist film having an opening in the FBC formation region and a silicon nitride film 590 corresponding to the silicon nitride film 211 in the first embodiment are used as masks to ion-implant boron at an acceleration energy of 3 keV and a dose of $1\times10^{13}$ cm$^{-2}$.

After that, the resist film 590 is removed.

RTA (Rapid Thermal Annealing) is then performed to activate the doped impurity.

As a consequence, boron is doped at a concentration of $1\times10^{18}$ cm$^{-3}$ in the two end portions of the body region 536.

After that, the semiconductor device of this embodiment can be completed through the same steps as in the fabrication method according to the first embodiment.

Of the steps of forming the structure shown in FIGS. 10 and 11, however, the step of doping boron at a concentration of $1\times10^{18}$ cm$^{-3}$ in the support substrate 510 is unnecessary.

Also, boron is doped at a concentration of $1\times10^{17}$ cm$^{-3}$ in the SOI layer in order to form a fully-depleted device in the region below the gate insulating film.

In the fabrication method of this embodiment, the silicon nitride film 590 formed in the region where the gate insulating film is to be formed is used as a mask to ion-implant boron in the two end portions of the body region 536. Therefore, the boron concentration in regions except for the region where the gate insulating film is to be formed can be increased with high controllability.

Accordingly, it is possible to suppress variations in difference between drain currents corresponding to data "0" and data "1", and provide a high-yield DRAM Also, in this fabrication method, the silicon nitride film 590 formed in the region where the first gate insulating film is to be formed is used as a mask to ion-implant boron in the two end portions of the SOI layer. This obviates the need to limit the ion implantation region of boron by forming a very small pattern by using the advanced lithography technique. As a consequence, the fabrication cost can be reduced.

As described above, the semiconductor devices and the methods of fabricating the same according to the embodiments of the present invention can provide an FBC having a long data holding time, and this increases the yield.

The embodiments described above are merely examples, and can be variously modified within the technical scope of the present invention.

What is claimed is:

1. A semiconductor memory device with floating body cells comprising:
    a plurality of transistors to constitute said floating body cells each having
        a semiconductor substrate,
        a first-conductivity-type semiconductor layer formed on said semiconductor substrate via a first insulating film, and having a single-crystalline structure,
        a second-conductivity-type source region and a second-conductivity-type drain region formed in said semiconductor layer,
        a first-conductivity-type body region formed between said source region and said drain region in said semiconductor layer, and said body region being electrically floating, and
        a gate electrode formed on a surface of a central portion of said body region via a second insulating film;
    an element isolation insulating film which isolates said body regions in adjacent transistors of said plurality of transistors;
    a word line which connects said gate electrodes of said plurality of transistors together;
    a bit line electrically connected to said drain region; and
    a source line electrically connected to said source region,
    wherein in a section along said word line, a length of a boundary between the central portion of said body region and said second insulating film is smaller than a length of a boundary between said body region and said first insulating film;
    wherein a second-conductivity-type counter impurity is doped in a surface portion of the central portion of the body region on which said second insulating film is formed.

2. A device according to claim 1, wherein in the central portion of said body region, boron is doped as the first-conductivity-type impurity, and arsenic is doped as the counter impurity.

3. A device according to claim 1, wherein said floating body cell has a first data state in which majority carriers are accumulated in said body region, and a second data state in which the majority carriers accumulated in said body region are emitted.

4. A device according to claim 1, wherein said body region consists of a central portion and a pair of end portions, a top surface of the central portion being covered with a second insulating film on which a gate electrode is formed, said central portion and said pair of end portions being formed along said word line direction.

5. A device according to claim 1, wherein a bottom surface of said element isolation insulating film is in contact with said first insulating film.

6. A semiconductor memory device with floating body cells comprising:
    a plurality of transistors to constitute said floating body cells each having
        a semiconductor substrate,
        a first-conductivity-type semiconductor layer formed on said semiconductor substrate via a first insulating film, and having a single-crystalline structure,
        a second-conductivity-type source region and a second-conductivity-type drain region formed in said semiconductor layer,
        a first-conductivity-type body region formed between said source region and said drain region in said semiconductor layer, and said body region being electrically floating, and
        a gate electrode formed on a surface of a central portion of said body region via a second insulating film;
    an element isolation insulating film which isolates said body regions in adjacent transistors of said plurality of transistors;
    a word line which connects said gate electrodes of said plurality of transistors together;
    a bit line electrically connected to said drain region; and
    a source line electrically connected to said source region,
    wherein in a section along said word line, a length of a boundary between the central portion of said body region said second insulating film is smaller than a length of a boundary between said body region and said first insulating film;
    wherein a net impurity concentration in a surface portion of the central portion of the body region on which said second insulating film is formed is lower than a net impurity concentration in a region except for the surface portion.

7. A device according to claim 6, wherein said floating body cell has a first data state in which majority carriers are accumulated in said body region, and a second data state in which the majority carriers accumulated in said body region are emitted.

8. A device according to claim 6, wherein said body region consists of a central portion and a pair of end portions, a top surface of the central portion being covered with a second insulating film on which a gate electrode is formed, said central portion and said pair of end portions being formed along said word line direction.

9. A device according to claim 6, wherein a bottom surface of said element isolation insulating film is in contact with said first insulating film.

10. A semiconductor memory device with floating body cells comprising:
a plurality of transistors to constitute said floating body cells each having
a semiconductor substrate,
a first-conductivity-type semiconductor layer formed on said semiconductor substrate via a first insulating film, and having a single-crystalline structure,
a second-conductivity-type source region and a second-conductivity-type drain region formed in said semiconductor layer,
a first-conductivity-type body region formed between said source region and said drain region in said semiconductor layer, and said body region being electrically floating, and
a gate electrode formed on a surface of a central portion of said body region via a second insulating film;
an element isolation insulating film which isolates said body regions in adjacent transistors of said plurality of transistors;
a word line which connects said gate electrodes of said plurality of transistors together;
a bit line electrically connected to said drain region; and
a source line electrically connected to said source region,
wherein in a section along said word line, a length of a boundary between the central portion of said body region said second insulating film is smaller than a length of a boundary between said body region and said first insulating film;
wherein the central portion of the body region on which said second insulating film is formed is completely depleted because a thickness of the central portion is smaller than a width of a maximum depletion layer formed when a predetermined potential is applied to said gate electrode.

11. A device according to claim 10, wherein said floating body cell has a first data state in which majority carriers are accumulated in said body region, and a second data state in which the majority carriers accumulated in said body region are emitted.

12. A device according to claim 10, wherein said body region consists of a central portion and a pair of end portions, a top surface of the central portion being covered with a second insulating film on which a gate electrode is formed, said central portion and said pair of end portions being formed along said word line direction.

13. A device according to claim 10, wherein a bottom surface of said element isolation insulating film is in contact with said first insulating film.

14. A device according to claim 12, wherein said end portions of said body region are not completely depleted.

* * * * *